(12) United States Patent
Yang et al.

(10) Patent No.: US 11,594,536 B2
(45) Date of Patent: Feb. 28, 2023

(54) INTEGRATED ASSEMBLIES AND SEMICONDUCTOR MEMORY DEVICES

(71) Applicant: Micron Technology, Inc., Boise, ID (US)

(72) Inventors: Yong Mo Yang, Boise, ID (US); Mohd Kamran Akhtar, Boise, ID (US); Huyong Lee, Boise, ID (US); Sangmin Hwang, Boise, ID (US); Song Guo, Boise, ID (US)

(73) Assignee: Micron Technology, Inc., Boise, ID (US)

(*) Notice: Subject to any disclaimer, the term of this patent is extended or adjusted under 35 U.S.C. 154(b) by 142 days.

(21) Appl. No.: 17/197,253

(22) Filed: Mar. 10, 2021

(65) Prior Publication Data

US 2022/0293598 A1   Sep. 15, 2022

(51) Int. Cl.
*H01L 27/092* (2006.01)
*H01L 21/8238* (2006.01)
*G11C 7/06* (2006.01)

(52) U.S. Cl.
CPC ........... *H01L 27/0924* (2013.01); *G11C 7/06* (2013.01); *H01L 21/8238* (2013.01)

(58) Field of Classification Search
CPC .... H01L 27/0924; H01L 21/8238; G11C 7/06
See application file for complete search history.

(56) References Cited

U.S. PATENT DOCUMENTS

| | | | |
|---|---|---|---|
| 9,543,298 B1 | 1/2017 | Zang et al. | |
| 9,865,704 B2 | 1/2018 | Xie et al. | |
| 10,256,155 B1 | 4/2019 | Lin et al. | |
| 10,297,290 B1* | 5/2019 | Beigel | H01L 21/823857 |
| 10,586,795 B1* | 3/2020 | Sills | G11C 5/025 |
| 10,811,405 B2* | 10/2020 | Yoshida | H01L 27/1116 |
| 11,239,242 B2* | 2/2022 | Yang | H01L 27/10814 |
| 2016/0329276 A1* | 11/2016 | Lin | H01L 27/0207 |
| 2017/0053917 A1* | 2/2017 | Azmat | H01L 27/0207 |
| 2017/0141211 A1 | 5/2017 | Xie et al. | |

(Continued)

OTHER PUBLICATIONS

Hwang et al., U.S. Appl. No. 17/150,020, titled "Integrated Assemblies and Semiconductor Memory Devices", filed Jan. 15, 2021, 35 pages.

*Primary Examiner* — Bac H Au
(74) *Attorney, Agent, or Firm* — Wells St. John P.S.

(57) ABSTRACT

Some embodiments include an integrated assembly having a CMOS region with fins extending along a first direction, and with gating structures extending across the fins. A circuit arrangement is associated with the CMOS region and includes a pair of the gating structures spaced by an intervening region having a missing gating structure. The circuit arrangement has a first dimension along the first direction. A second region is proximate to the CMOS region. Conductive structures are associated with the second region. Some of the conductive structures are electrically coupled with the circuit arrangement. A second dimension is a distance across said some of the conductive structures along the first direction. The conductive structures and the circuit arrangement are aligned such that the second dimension is substantially the same as the first dimension. Some embodiments include methods of forming integrated assemblies.

17 Claims, 27 Drawing Sheets

(56) References Cited

U.S. PATENT DOCUMENTS

| | | | |
|---|---|---|---|
| 2018/0012891 A1* | 1/2018 | Yabuuchi | H01L 21/823892 |
| 2018/0174650 A1* | 6/2018 | Chung | G11C 13/0007 |
| 2020/0035272 A1* | 1/2020 | Nakaoka | G11C 29/026 |
| 2020/0286895 A1* | 9/2020 | Tang | H01L 27/10876 |
| 2020/0286906 A1* | 9/2020 | Karda | G11C 5/06 |
| 2020/0365589 A1* | 11/2020 | Liaw | H01L 27/0207 |
| 2022/0231029 A1* | 7/2022 | Hwang | G11C 11/4085 |
| 2022/0320281 A1* | 10/2022 | Lan | H01L 29/0673 |

\* cited by examiner

INTEGRATED ASSEMBLIES AND SEMICONDUCTOR MEMORY DEVICES

TECHNICAL FIELD

Integrated assemblies. Integrated memory. Multideck assemblies. FinFET, CMOS, FinFET integration, CMOS integration, etc.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bitlines, data lines, sense lines, or data/sense lines) and access lines (which may also be referred to as wordlines). The digit lines may extend along columns of the array, and the access lines may extend along rows of the array. Each memory cell may be uniquely addressed through the combination of a digit line and an access line.

Memory cells may be volatile or nonvolatile. Nonvolatile memory cells can store data for extended periods of time, including when a computer is turned off. Volatile memory dissipates and therefore is rapidly refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

Some memory cells may include a transistor in combination with a capacitor (or other suitable charge-storage device). The transistor is utilized to selectively access the capacitor, and may be referred to as an access device. The capacitor may electrostatically store energy as an electric field within capacitor dielectric between two capacitor electrodes. The electrical state of the capacitor may be utilized to represent a memory state.

The wordlines may be coupled with wordline-driver-circuitry, and the digit lines may be coupled with sense-amplifier-circuitry. The wordline-driver-circuitry and sense-amplifier-circuitry may be within a CMOS region of an integrated assembly.

Memory is one example of integrated circuitry, and many other types of integrated circuitry are known (e.g., sensor circuitry, logic circuitry, etc.). Such other types of integrated circuitry may be utilized in combination with integrated memory in some applications.

A continuing goal of integrated assembly fabrication is to increase the level of integration, or, in other words, to pack ever-more memory into ever-decreasing space. It is desired to develop new architectures for integrated assemblies, and it is desired for such new architectures to be suitable for highly-integrated applications.

BRIEF DESCRIPTION OF THE DRAWINGS

FIGS. 6, 6A and 6B illustrate alternative process stages relative to one another.

FIGS. 8A and 8B illustrate alternative process stages relative to one another.

DETAILED DESCRIPTION OF THE ILLUSTRATED EMBODIMENTS

Some embodiments include architectures (integrated assemblies) having CMOS regions with fins (i.e., FinFET arrangements), and having conductive lines (e.g., wordlines, digit lines, etc.) aligned with circuit arrangements (e.g., WORDLINE DRIVERS, SENSE AMPLIFIERS, etc.) associated with the CMOS regions. Example embodiments are described with reference to FIGS. 1-18.

Figure 1:
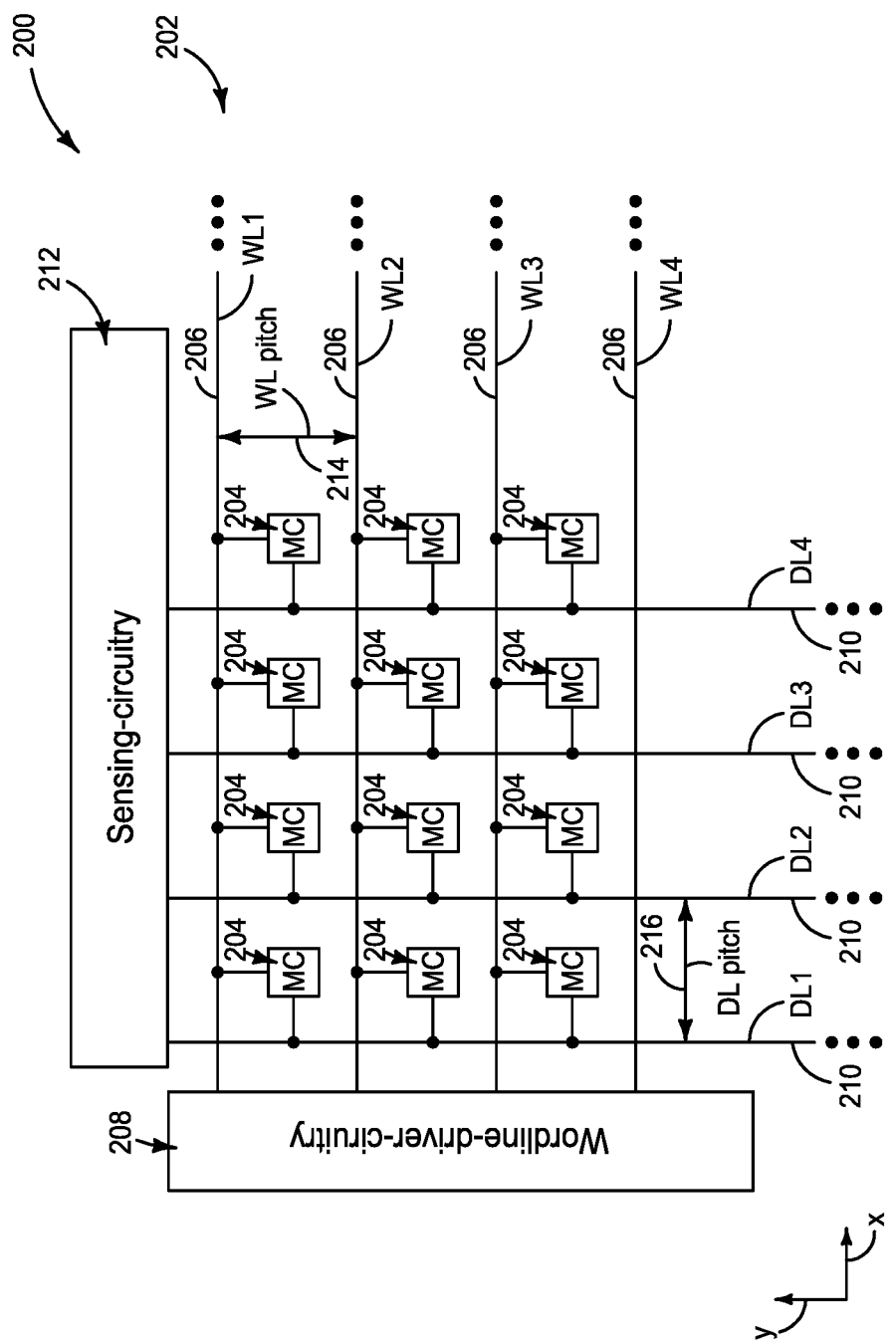
FIG. 1 is a schematic diagram of an example region of an example integrated memory array.

Referring to FIG. 1, an integrated assembly 200 is shown to comprise memory cells (MC) 204 arranged within a memory array 202. The memory cells may be any suitable memory cells either now known or yet to be developed. In some embodiments, the memory cells may be configured for utilization in dynamic random-access memory (DRAM). In such embodiments, the memory cells may each comprise an access device (e.g., a transistor) in combination with a storage-element (e.g., a capacitor).

Wordlines (access lines) 206 extend along a first direction (an illustrated x-axis direction), and cross the memory array 202. The illustrated wordlines are labeled as WL1-WL4. The wordlines are coupled with wordline-driver-circuitry 208 (e.g., WORDLINE DRIVERS).

Digit lines (bitlines, sense lines) 210 extend along a second direction (an illustrated y-axis direction), and cross the memory array 202. The illustrated digit lines are labeled as DL1-DL4. The digit lines are coupled with sensing-circuitry (e.g., SENSE AMPLIFIERS) 212.

The term "sense/access line" may be utilized to generically refer to wordlines and digit lines.

Each of the memory cells 204 may be considered to be uniquely addressed by one of the wordlines 206 in combination with one of the digit lines 210.

In the shown embodiment, the second direction (y-axis direction) is orthogonal to the first direction (x-axis direction). Generally, the digit lines 210 extend orthogonally, or at least substantially orthogonally, relative to the wordlines 206; with the term "substantially orthogonal" meaning orthogonal to within reasonable tolerances of fabrication and measurement.

In some embodiments, the wordlines 206 may be considered to be a first set of conductive lines, and the digit lines 210 may be considered to be a second set of conductive lines. The first and second sets of conductive lines cross one another, and in the illustrated embodiment are shown to be orthogonal to one another (or at least substantially orthogonal to one another).

The wordlines 206 are shown to be spaced from one another by a wordline pitch 214 (WL pitch), and the digit lines 210 are shown to be spaced from another by a digit line pitch 216 (DL pitch). The wordline pitch may be the same as the digit line pitch (or at least substantially the same as the digit line pitch), or may be different than the digit line pitch. It is noted that the pitch is not simply the space between features, but instead refers to a measurement on which a pattern repeats. Thus, the pitch includes, for example, a feature width and a width of a space between neighboring features (or, sometimes, half of the width of the space and half of the width of the features). In the case of wordlines and digit lines (with "WL/DL" being generic to wordlines and digit lines) the pitch may include the width of a WL/DL together with the width of a space between neighboring WLs/DLs.

In practice, a semiconductor assembly may comprise one or more regions containing CMOS circuitry, and the driver circuitry 208 and sensing circuitry 212 may include devices associated with the CMOS circuitry. One or more memory arrays may be formed within region(s) of a semiconductor assembly proximate the CMOS circuitry, and the wordlines 206 and digit lines 210 of the array(s) may be coupled with the devices associated with the CMOS circuitry.

It may be challenging to align the wordlines 206 and the digit lines 210 with the devices associated with the CMOS circuitry, and embodiments described below may be utilized to address such challenges. The wordlines and digit lines are examples of conductive structures which may be aligned with CMOS-circuit-devices. The embodiments described below are primarily presented relative to the alignment of digit lines with CMOS-circuit-devices (e.g., sense-amplifier-circuitry), but persons of ordinary skill will understand that the embodiments may be utilized for aligning other conductive structures (e.g., wordlines) with CMOS-circuit-devices (e.g., wordline-driver-circuitry).

Figure 2:
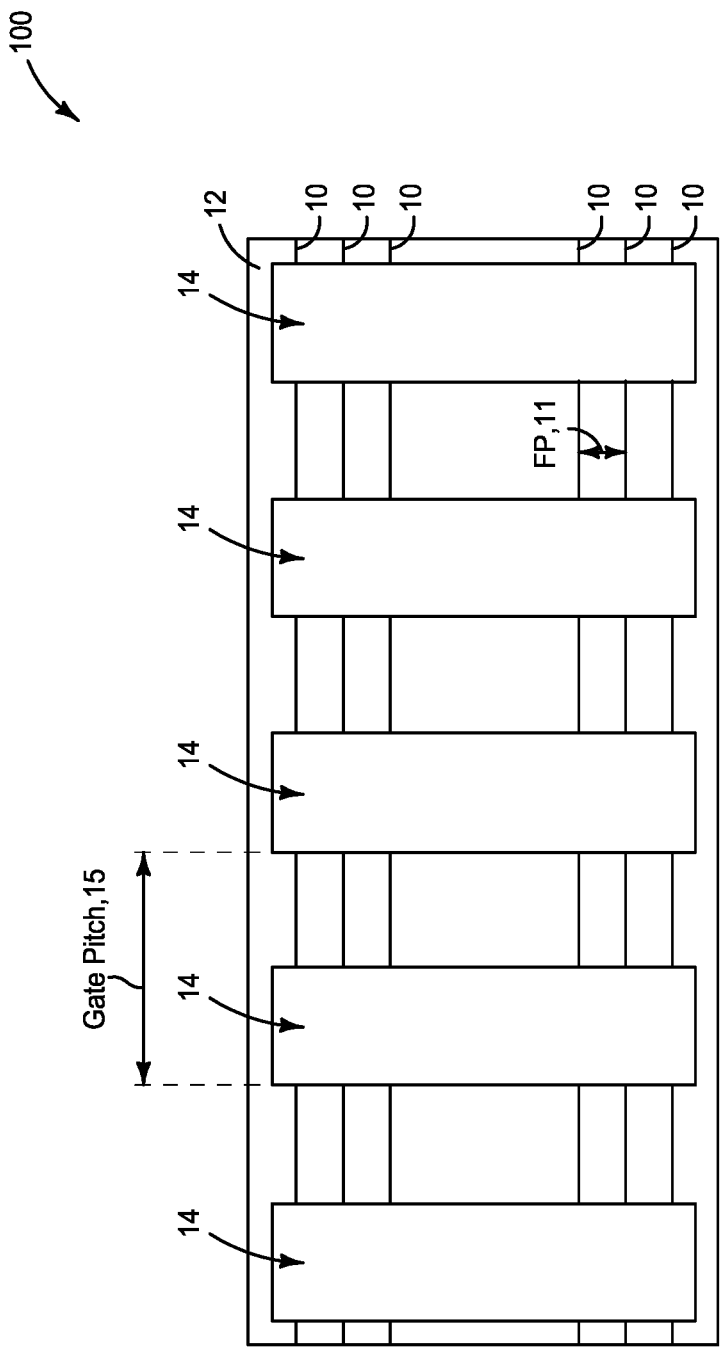
FIG. 2 is a diagrammatic top-down view of an example region of an example CMOS-containing semiconductor base.

FIG. 2 shows a portion of a CMOS region 100. The CMOS region may be formed in a semiconductor base 12. The base 12 may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

Fins 10 extend across the CMOS region 100. The fins may be raised regions of the semiconductor material (e.g., monocrystalline silicon) of the substrate 12. The fins may extend across the entirety of the CMOS region 100, and are incorporated into FinFETs (fin field-effect transistors). The fins 10 are on a fin pitch (FP) 11, with such fin pitch being established by a fabrication process utilized to form the fins.

Gating structures 14 extend across the fins 10. The gating structures may comprise any suitable material(s), and in some embodiments may comprise silicon (e.g., polycrystalline silicon, amorphous silicon, mixtures of polycrystalline silicon and amorphous silicon, etc.), metal, metal-containing material (e.g., metal nitride, metal silicide, etc.), etc. The gating structures 14 are on a gate pitch 15.

The fins 10 are shown to extend along a first direction (a direction of an illustrated $A_1$ axis), and the gating structures 14 are shown extend along a second direction (a direction of an illustrated $A_2$ axis); with the second direction being orthogonal to (or at least substantially orthogonal to) the first direction.

The gating structures 14 and the fins 10 may be incorporated into circuit arrangements (e.g., WORDLINE DRIVERS, SENSE AMPLIFIERS, etc.) associated with the CMOS 100. The circuit arrangements associated with the CMOS may be coupled with conductive structures (e.g., wordlines, bitlines) associated with a memory array. Problems may be encountered in achieving the desired the desired alignment between the circuit arrangements associated with the CMOS and the conductive structures associated with the memory array. Such problems are addressed in the discussion that follows.

Figure 3:
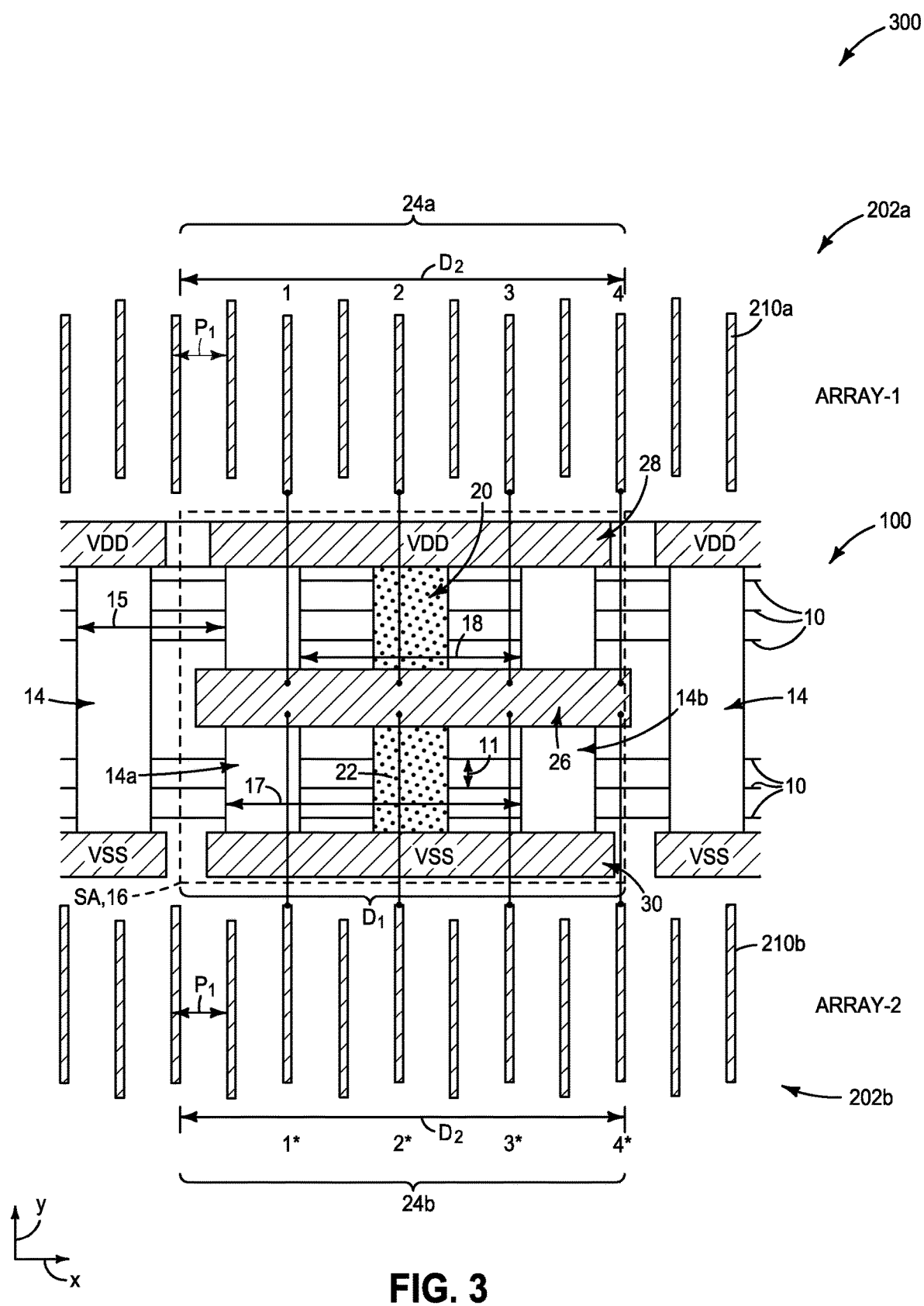
FIG. 3 is a diagrammatic top-down view of an example region of an example CMOS-containing semiconductor base and one or more example regions of integrated memory arrays proximate the base.

Referring to FIG. 3, a region of an integrated assembly 300 is illustrated. Specifically, portions of memory array regions 202a (ARRAY-1) and 202b (ARRAY-2) are shown proximate a portion of the CMOS region 100. One of the array regions 202a and 202b may be referred to as a second region which is provided proximate to a first region corresponding to the CMOS region 100, and the other of the array regions 202a and 202b may be referred to as a third region. In some embodiments, the regions 202a and 202b may be referred to as first and second memory array regions, respectively, which are offset relative to one another; and the CMOS region 100 may be considered to be between the first and second memory array regions.

The array regions 202a and 202b are shown to be laterally offset from one another and from the illustrated portion of the CMOS region 100. It is to be understood, however, that the array regions may be in any suitable location relative to one another and to the CMOS region. For instance, at least portions of the array regions 202a and 202b may be vertically offset from the illustrated portion of the CMOS region either alternatively to, or in addition to, being laterally offset from the illustrated portion of the CMOS region (i.e., the array regions 202a and 202b may be over the CMOS region 100 in CMOS-under-array configurations).

The CMOS region 100 comprises the fins 10 arranged on the fin pitch 11, and comprises the gating structures 14 arranged on the gate pitch 15. A SENSE AMPLIFIER circuit 16 is associated with the CMOS region 100. The SENSE AMPLIFIER circuit includes a pair of the gating regions 14a and 14b, and such gating regions are spaced from one another by an intervening region 18. A gating structure should be within the intervening region 18, but instead such gating structure is removed and replaced with a region 20 corresponding to a missing gating structure. The region 20 may comprise an insulative material 22. The insulative material 22 is shown with stippling to emphasize to the reader that the region 20 is different from the gating regions 14.

The missing gating structure of region 20 effectively increases the pitch between the remaining gating structures of the SENSE AMPLIFIER circuit 16, and in the shown embodiment such remaining gating structures 14a and 14b may be considered to be on an extended pitch 17 which is larger than the gating structure pitch 15. In some embodiments, the pitches 15 and 17 may be referred to as first and second pitches, respectively.

The circuit arrangement 16 is shown comprising segments of six fins 10, two gating structures 14, and one region 20 of a missing gating structure. In other embodiments, the circuit arrangement may comprise more than six fins or fewer than six fins, more than two of the gating structures, and more than one of the regions 20 of the missing gating structure.

The fins 10 may be considered to extend along a first direction corresponding to the illustrated x-axis direction of FIG. 3. The SENSE AMPLIFIER circuit has a dimension $D_1$ along such first direction.

The array region 202a comprises first digit lines 210a arranged on a pitch $P_1$, and the array region 202b comprises second digit lines 210b which are also arranged on the pitch $P_1$. The digit lines extend along a second direction which crosses the first direction of the fins 10, and in the shown embodiment extend along an illustrated y-axis direction of FIG. 3. The illustrated direction of the digit lines is orthogonal to (or at least substantially orthogonal to) the illustrated direction of the fins 10, and in the shown embodiment is parallel to (or at least substantially parallel to) the direction of the gating structures 14. Also, in the shown embodiment the digit lines 210a of the first array 202a are parallel to (or at least substantially parallel to) the digit lines 210b of the second array 202b. The pitch $P_1$ of the digit lines 210a/210b may be substantially different than the fin pitch 11 and the gating structure pitch 15, and in some embodiments may be substantially smaller than the pitches 11 and 15.

The illustrated digit lines 210a/210b may represent only a small subset of the total number of digit lines with the memory arrays 202a and 202b. For instance, in some embodiments the arrays may comprise hundreds, thousands, hundreds of thousands, millions, etc., of the digit lines 210a/210b.

In the illustrated application, four of the digit lines 210a from the first array 202a are coupled with the circuit arrangement 16 (the SENSE AMPLIFIER circuit), and four of the digit lines 210b from the second array 202b are also coupled with the circuit arrangement 16. The digit lines 210a coupled with the SENSE AMPLIFIER circuit are labeled 1-4, and the digit lines 210b coupled with the SENSE AMPLIFIER circuit are labeled 1*-4*. The digit lines labeled with a simple numeral (e.g., the digit line labeled 1) may be considered to be true digit lines, and the digit lines labeled with a numeral and an asterisk (e.g., the digit line labeled 1*) may be considered to be complementary digit lines. The true and complementary digit lines may be comparatively coupled to one another through the SENSE AMPLIFIER circuit 16. For purposes of understanding this disclosure and the claims that follow, a first digit-line is "comparatively coupled" with a second digit-line through sense-amplifier-circuitry if the sense-amplifier-circuitry is configured to compare electrical properties (e.g., voltage) of the first and second digit-lines with one another. It is noted that the terms "true" and "complementary" are arbitrary as utilized to label digit lines, and are simply used to differentiate the digit-lines which are compared to one another through sense-amplifier-circuitry.

The four digit lines 1-4 of the array 202a are a subset of eight digit lines aligned with the SENSE AMPLIFIER circuit 16, with such 8 digit lines being identified with a bracket 24a. Similarly, the four digit lines 1*-4* of the array 202b are a subset of eight digit lines aligned with the SENSE AMPLIFIER circuit 16, with such 8 digit lines being identified with a bracket 24b. A second dimension $D_2$ extends across the 8 digit lines within the bracket 24a and across the 8 digit lines within the bracket 24b.

The circuit arrangement 16 has a conductive pad 26 configured for coupling with the digit lines 210. The conductive pad 26 is shown to be a single pad centrally located within the circuit arrangement 16 for purposes of illustration. In other embodiments, there may be two or more pads 26. The pad(s) 26 may be in any suitable location(s) within the circuit arrangement 16. The illustrated circuit arrangement 16 is also shown to have a conductive structure (e.g., bar) 28 coupled with a first voltage supply terminal (e.g. VDD), and a conductive structure (e.g., bar) 30 coupled with a second voltage supply terminal (e.g. VSS), as would be appropriate for a SENSE AMPLIFIER circuit.

One of the dimensions $D_1$ and $D_2$ may be referred to as a first dimension while the other is referred to as a second dimension. It is desired that the first and second dimensions $D_1$ and $D_2$ be the same as one another (or at least substantially the same as one another, with the term "substantially the same" meaning the same to within reasonable tolerances of fabrication and measurement). Such enables the circuit arrangement 16 to match up with the conductive lines 210a and 210b that are coupled with such circuit arrangement, and thus may conserve valuable semiconductor real estate as compared to configurations in which the dimensions $D_1$ and $D_2$ are not substantially the same as one another.

The dimensions $D_1$ and $D_2$ may be matched to one another (or at least substantially matched to one another) by forming the missing gating structure region 20 to thereby tailor the dimension $D_1$ of CMOS circuit arrangement 16.

The configuration of FIG. 3 corresponds to an open memory architecture in which each of regions 24a and 24b of the memory arrays 202a and 202b has four digit lines coupled with the SENSE AMPLIFIER circuit 16, and has four digit lines which are not coupled with the SENSE AMPLIFIER circuit 16 (but which may be coupled with other SENSE AMPLIFIER circuits laterally outward of the shown region of the assembly 300). In the shown embodiment, the digit lines which are not coupled with the illustrated SENSE AMPLIFIER circuit 16 alternate with those that are coupled with the illustrated SENSE AMPLIFIER circuit 16, and specifically alternate along the direction of the x-axis.

The illustrated circuit arrangement 16 may be representative of a large number of substantially identical circuit arrangements formed within the CMOS region 100 and coupled with digit lines of the memory arrays 202a and 202b.

The circuit arrangement 16 may be formed with any suitable processing. Example processes are described with reference to FIGS. 4-17.

Figure 4:
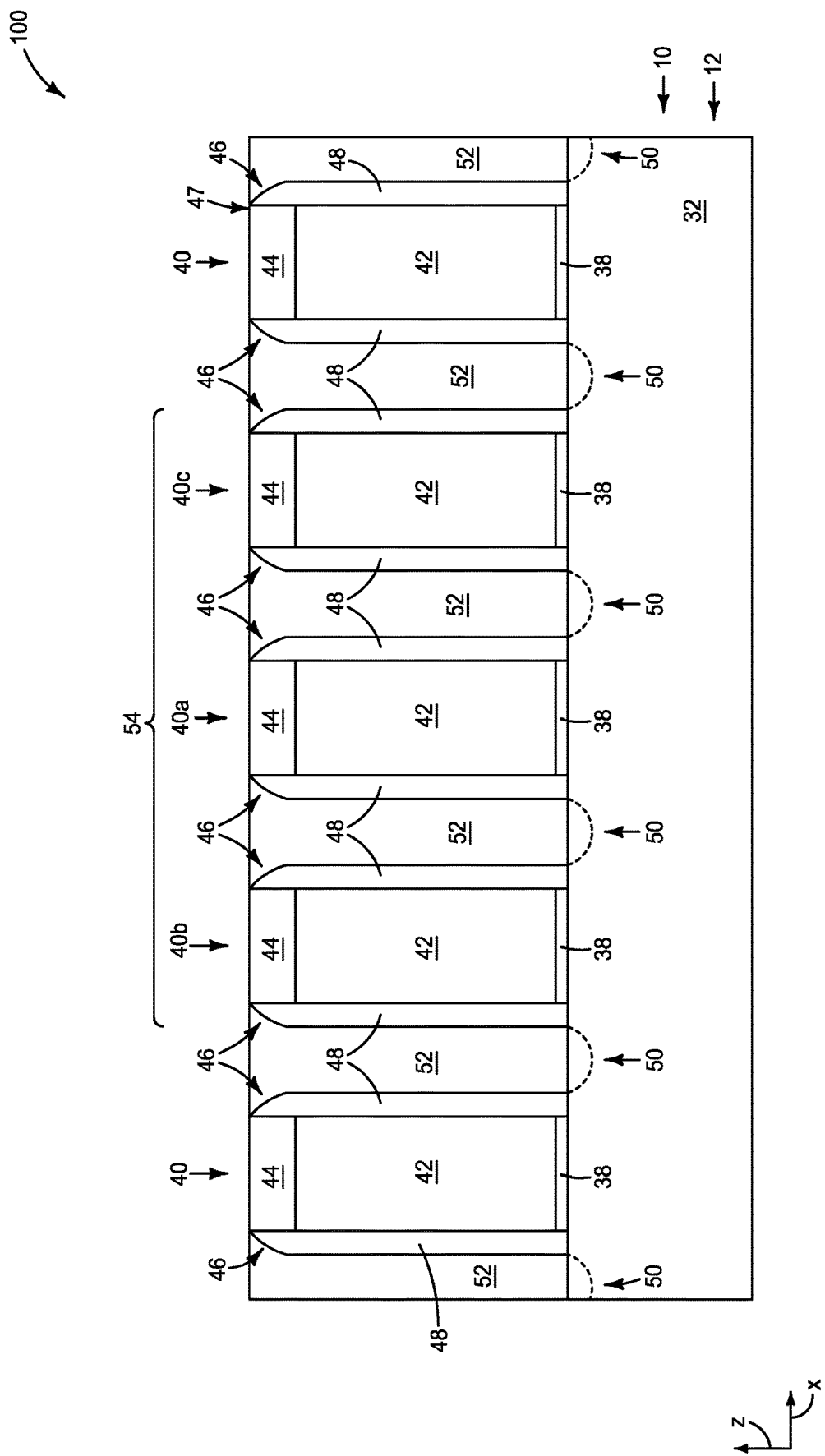
FIGS. 4, 4A and 4B are a diagrammatic cross-sectional side view, diagrammatic top-down view and diagrammatic cross-sectional side view, respectively, of an example region of an example CMOS-containing semiconductor base at an example process stage of an example method. The cross-sectional side view of FIG. 4B is along a cross-section orthogonal to that of FIG. 4.
Figure 4A:
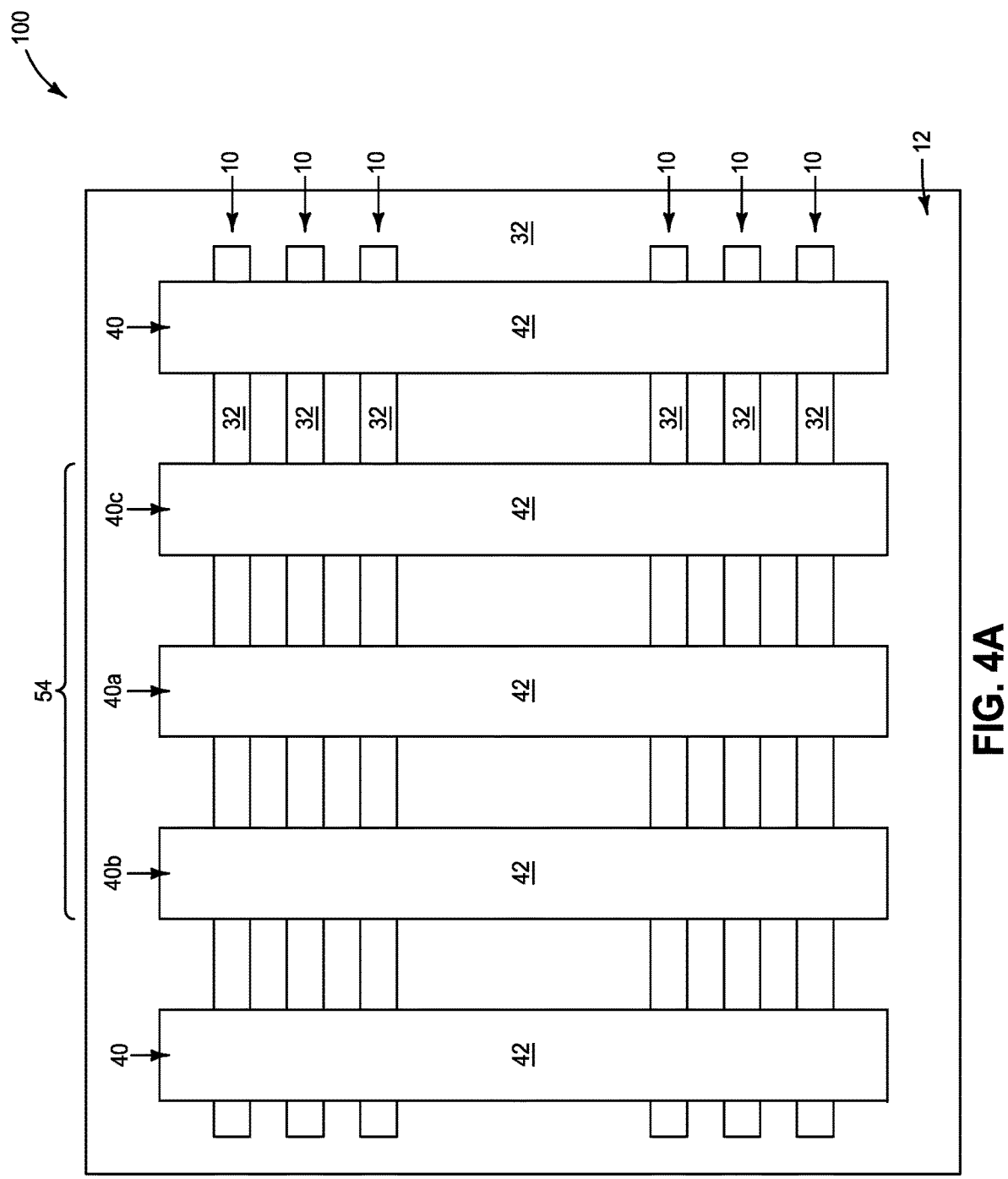
Figure 4B:
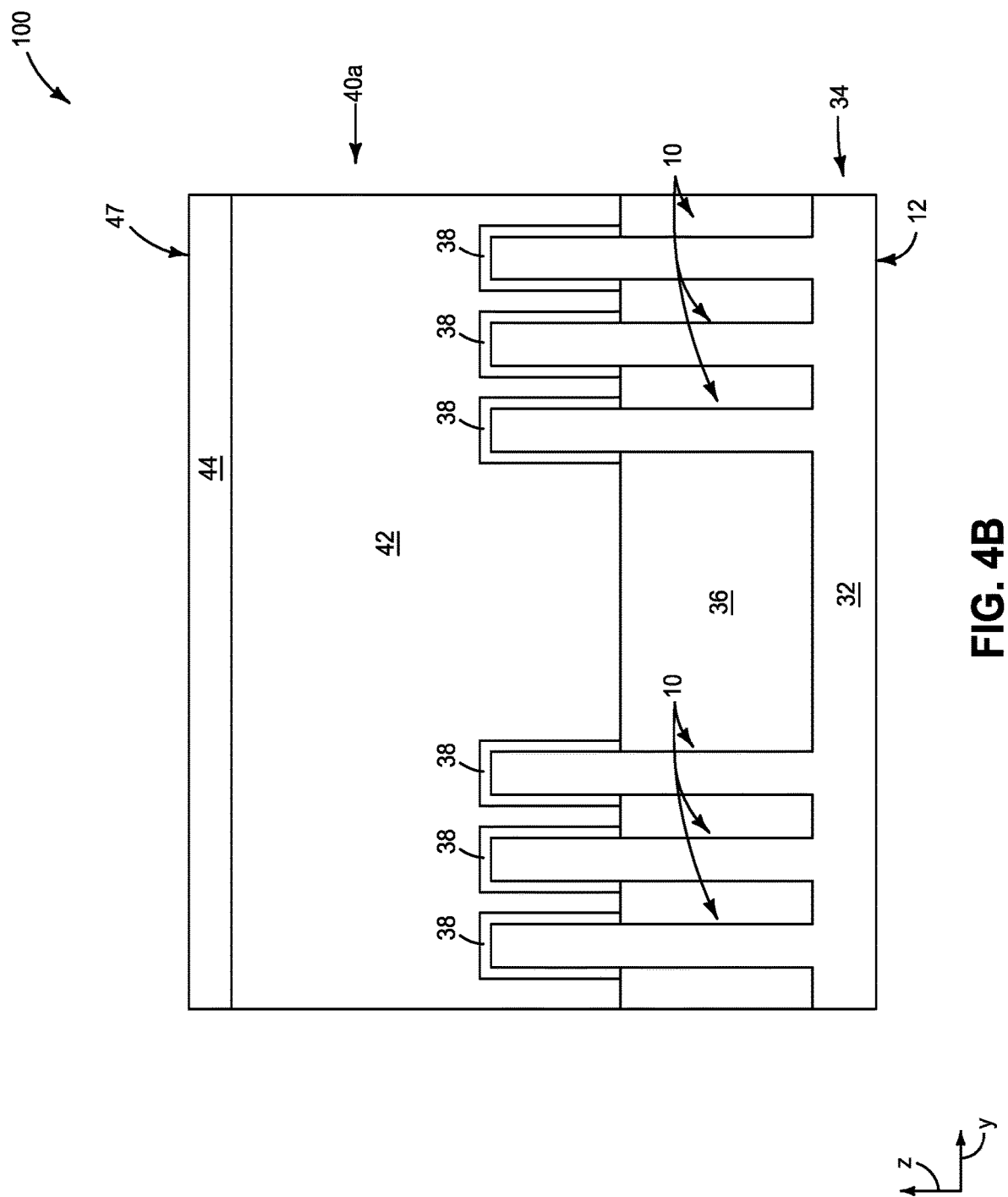

Referring to FIGS. 4-4B, a CMOS region 100 is illustrated in diagrammatic cross-sectional side view along an x-axis direction (FIG. 4), diagrammatic top-down view (FIG. 4A), and diagrammatic cross-sectional side view along a y-axis direction (FIG. 4B). The view of FIG. 4B shows deeper portions of the construction than does the view of FIG. 4. The top-down view of FIG. 4A shows primary features and does not correspond to a specific cross-section through the constructions of FIGS. 4 and 4B. Rather, the view of FIG. 4A is provided to orient the reader as to the general direction of primary features associated with the region 100.

The CMOS region 100 at the process stage of FIGS. 4-4B may be considered to correspond to a construction. The construction includes semiconductor material 32 configured as the base 12. The semiconductor material 32 of the base 12 is configured to include the fins 10 projecting upwardly from a foundation region (base region) 34. The semiconductor material 32 may comprise any suitable composition(s), and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). For instance, in some example embodiments the semiconductor material 32 may comprise, consist essentially of, or consist of monocrystalline silicon.

The fins 10 extend along a first direction corresponding to an illustrated x-axis direction.

An insulative material 36 extends over the foundation region 34 and partway up the fins, as shown in FIG. 4B. The material 36 may comprise any suitable composition(s), and in some embodiments may comprise, consist essentially of, or consist of silicon dioxide.

An insulative material 38 extends over upper surfaces of the fins 10, and along sidewall surfaces of upper regions of the fins. The insulative material 38 may be compositionally different than the insulative material 36, and may comprise any suitable composition(s). For instance the insulative material 38 may comprise, consist essentially of, or consist of one or more of aluminum oxide, hafnium oxide, zirconium oxide, silicon oxide, silicon nitride, tantalum oxide, etc.

Linear structures (features) 40 are over the fins, and in the shown embodiment extend along an illustrated y-axis direction. In some embodiments, the fins 10 may be considered to extend along a first direction and the linear structures 40 may be considered to extend along a second direction which crosses the first direction of the fins. In the shown embodiment, the second direction of the linear structures 40 is substantially orthogonal to the first direction of the fins 10.

The linear structures 40 comprise a primary material 42 and a capping material 44 (the capping material is not shown in the diagrammatic top-down view of FIG. 4A as it is not one of the principle features focused on with the view of FIG. 4A). The primary material 42 may comprise any suitable composition(s). In some embodiments, the primary material 42 is a sacrificial material, and is removed at a subsequent process stage described below with reference to FIG. 15. Accordingly, the material 42 may comprise composition(s) which may be selectively removed at the process stage of FIG. 15, including, for example, insulative material (silicon dioxide, silicon nitride, tantalum oxide, aluminum oxide, etc.), conductive material (metal, metal nitride, etc.; including, for example, titanium, titanium nitride, tungsten, tungsten nitride, etc.), and semiconductive material (e.g., silicon, germanium, etc.). In some embodiment, the primary material 42 is a conductive material of gate structures, and accordingly may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). If the primary material 42 comprises conductively-doped silicon, the silicon may be in any suitable crystalline form, including, for example, one or more of polycrystalline, amorphous, etc.

The capping material 44 may comprise any suitable composition(s), and in some embodiments may comprise, consist essentially of, or consist of silicon nitride.

Sidewall spacers 46 are along sidewall surfaces (lateral edges) of the linear structures 40, as shown in FIG. 4 (the sidewall spacers are not shown in the diagrammatic top-down view of FIG. 4A as they are not among the principle features focused on with the view of FIG. 4A).

The sidewall spacers 46 may extend along lateral edges of both the primary material 42 and the capping material 44 (as shown). The sidewall spacers 46 comprise spacer material 48. The spacer material 48 may comprise any suitable composition(s); and in some embodiments may comprise, consist essentially of, or consist of one or more of silicon dioxide, aluminum oxide, tantalum oxide, hafnium oxide, zirconium oxide, etc.

Source/drain regions 50 are between the linear structures 40, as shown in FIG. 4. Approximate boundaries of the source/drain regions are diagrammatically illustrated with dashed lines. The source/drain regions 50 are configured to be suitable for utilization in CMOS. In some embodiments, some of the source/drain regions 50 may be n-type doped while others are p-type doped.

Insulative material 52 is over the source/drain regions and between the linear structures 40, as shown in FIG. 4 (the insulative material 52 is not shown in the diagrammatic top-down view of FIG. 4A as it is not among the principle features focused on with the view of FIG. 4A). The insulative material 52 may comprise any suitable composition(s), and in some embodiments may comprise, consist essentially of, or consist of silicon dioxide. It is noted that both the spacer material 48 and the insulative material 52 may comprise silicon dioxide. It may be desirable for the materials 48 and 52 to be compositionally different from one another. If both comprise silicon dioxide, it may be desirable for one of the materials to be a low-k material (e.g., to comprise porous silicon dioxide, boron-doped silicon dioxide, carbon-doped silicon dioxide, etc.) while the other is not a low-k material. In some embodiments, the materials 48 and 52 may both comprise silicon dioxide, but may be of different density relative to one another.

Three of the illustrated linear structures 40 may be within a region 54 which will ultimately become a circuit arrangement associated the CMOS region 100. Such circuit arrangement may, for example, correspond to a SENSE AMPLIFIER circuit 16 of the type described above with reference to FIG. 3. One of said three linear structures may be considered to be a central linear structure 40a, and the other two of said three linear structures may be considered to be outer linear structures 40b and 40c.

A planarized upper surface 47 is shown to extend across the materials 44, 48 and 52. Such planarized surface may be formed with any suitable processing, such as, for example, chemical-mechanical polishing (CMP).

Figure 5:
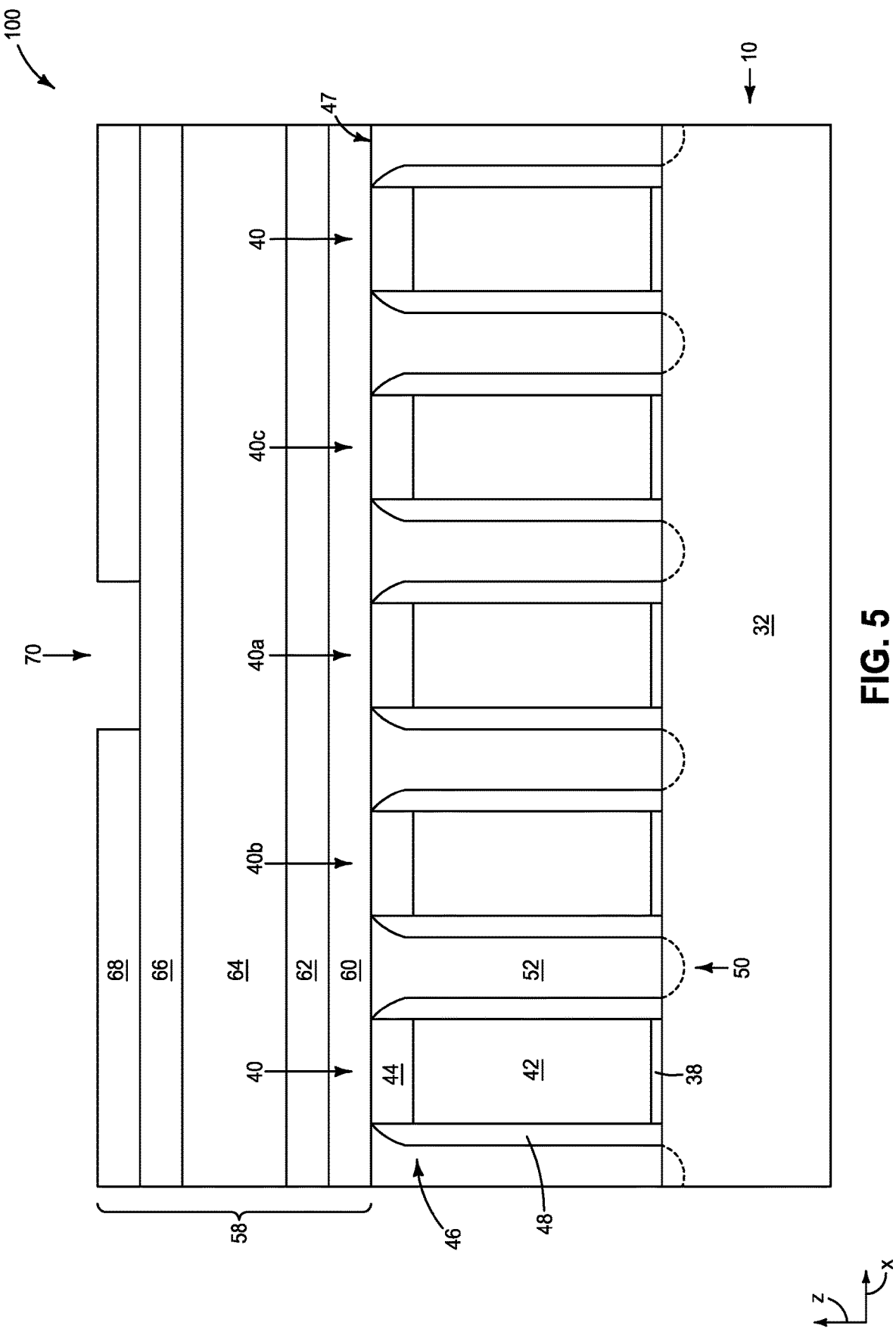
FIGS. 5, 5A and 5B are a diagrammatic cross-sectional side view, diagrammatic top-down view and diagrammatic cross-sectional side view, respectively, of the example region of the example CMOS-containing semiconductor base of FIGS. 4, 4A and 4B at an example process stage following that of FIGS. 4, 4A and 4B. The cross-sectional side view of FIG. 5B is along a cross-section orthogonal to that of FIG. 5.
Figure 5A:
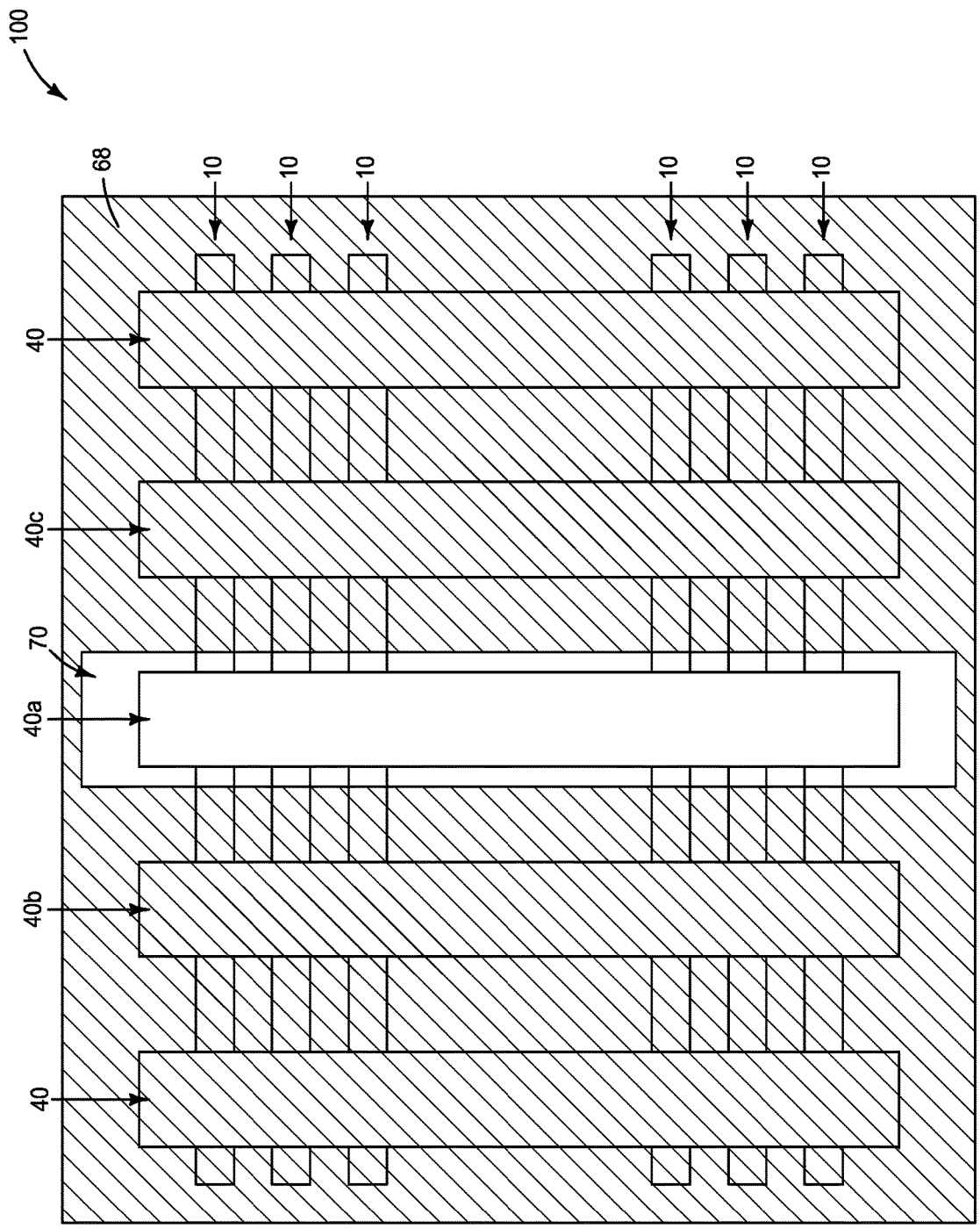
Figure 5B:
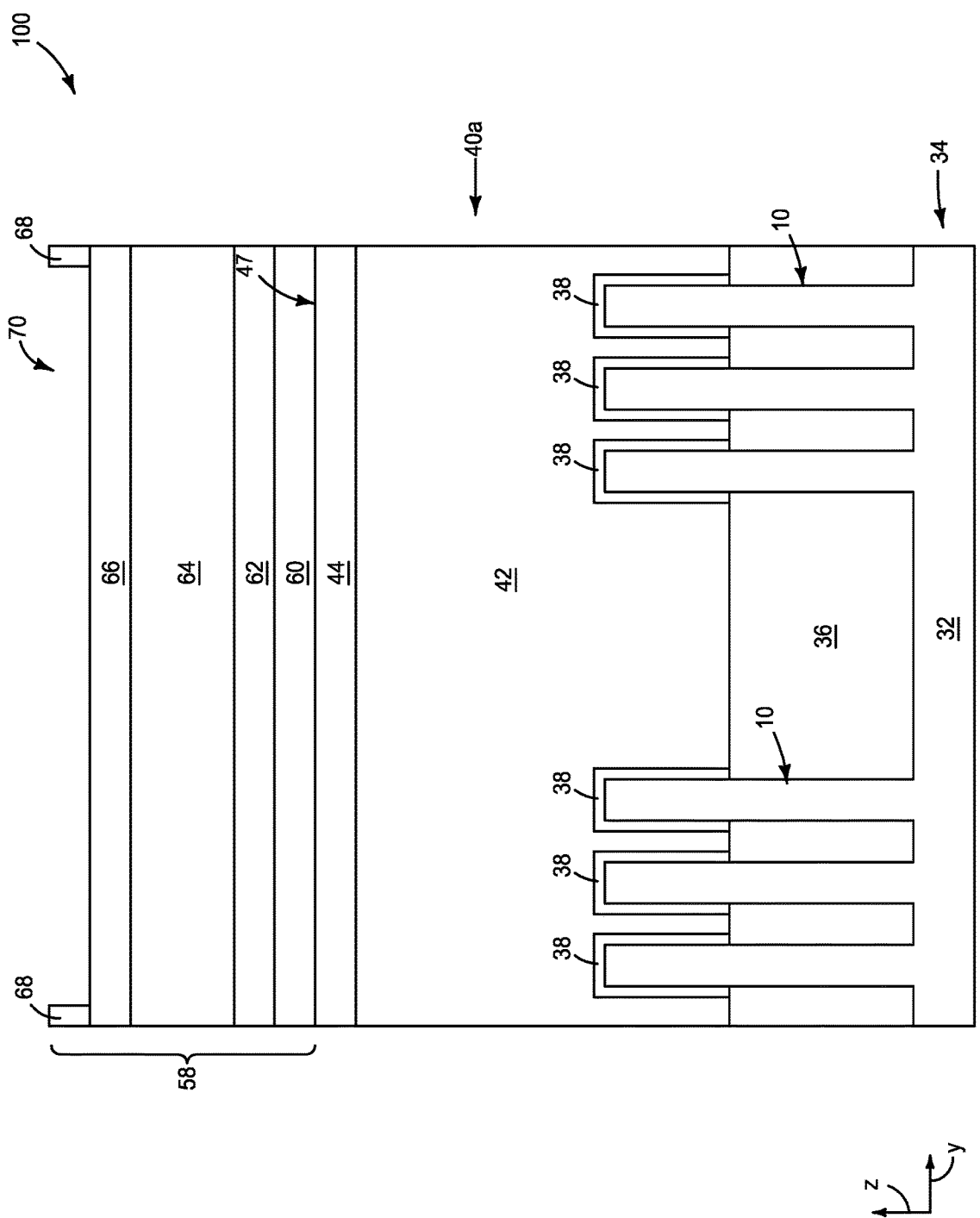

Referring to FIGS. 5-5B, the CMOS region 100 is shown at a process stage subsequent to that of FIGS. 4-4B. The views of FIGS. 5 and 5B are diagrammatic cross-sectional side views along the x-axis direction and the y-axis direction, respectively; with the view of FIG. 5B showing deeper portions of the region than does the view of FIG. 5. The top-down view of FIG. 5A shows primary features and does not correspond to a specific cross-section through the construction of FIGS. 5 and 5B.

FIGS. 5-5B show that a stack 58 of materials 60, 62, 64, 66 and 68 is formed over the upper surface 47. The materials 60, 62, 64, 66 and 68 may comprise any suitable compositions. In some embodiments, the material 60 may comprise, consist essentially of, or consist of silicon dioxide; the material 62 may comprise, consist essentially of, or consist of silicon nitride; the material 64 may comprise, consist essentially of, or consist of carbon (e.g., amorphous carbon); the material 66 may comprise an antireflective coating (e.g., may comprise, consist essentially of, or consist of silicon oxynitride); and the material 68 may comprise patterned resist (e.g., patterned photoresist).

The patterned resist 68 is configured to have an opening 70 extending therethrough, with such opening being directly over at least a portion of the central linear structure 40a. In the illustrated embodiment, the opening 70 exposes an entirety of the central linear structure 40a.

The top-down view of FIG. 5A indicates the location of the opening 70. The resist 68 is diagrammatically illustrated in FIG. 5A with cross-hatching, and is shown as being semi-transparent so that the features 40 and 10 may be viewed through the patterned photoresist. The materials 60, 62, 64 and 66 are not shown within the opening 70 of FIG. 5A in order to simplify the drawing.

Figure 6:
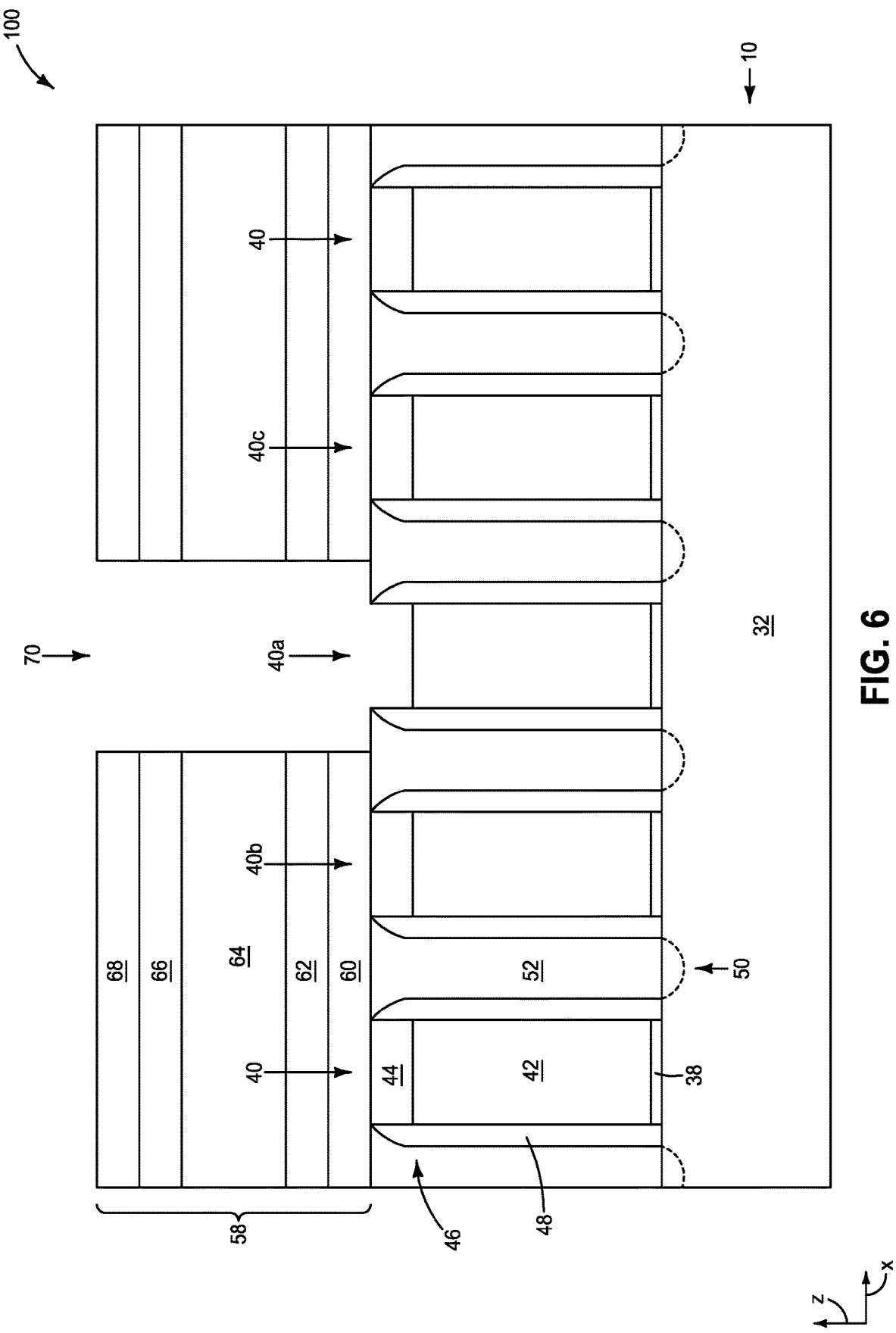
FIGS. 6, 6A and 6B are diagrammatic cross-sectional side views of an example region of the example CMOS-containing semiconductor base of FIGS. 4, 4A and 4B at an example process stage following that of FIGS. 5, 5A and 5B.

Referring to FIG. 6, the opening 70 is extended through the materials 60, 62, 64 and 66 of the stack 58 with one or more suitable etches, and is then extended through the capping material 44 of the central linear structure 40a with a suitable etch.

Figure 6A:
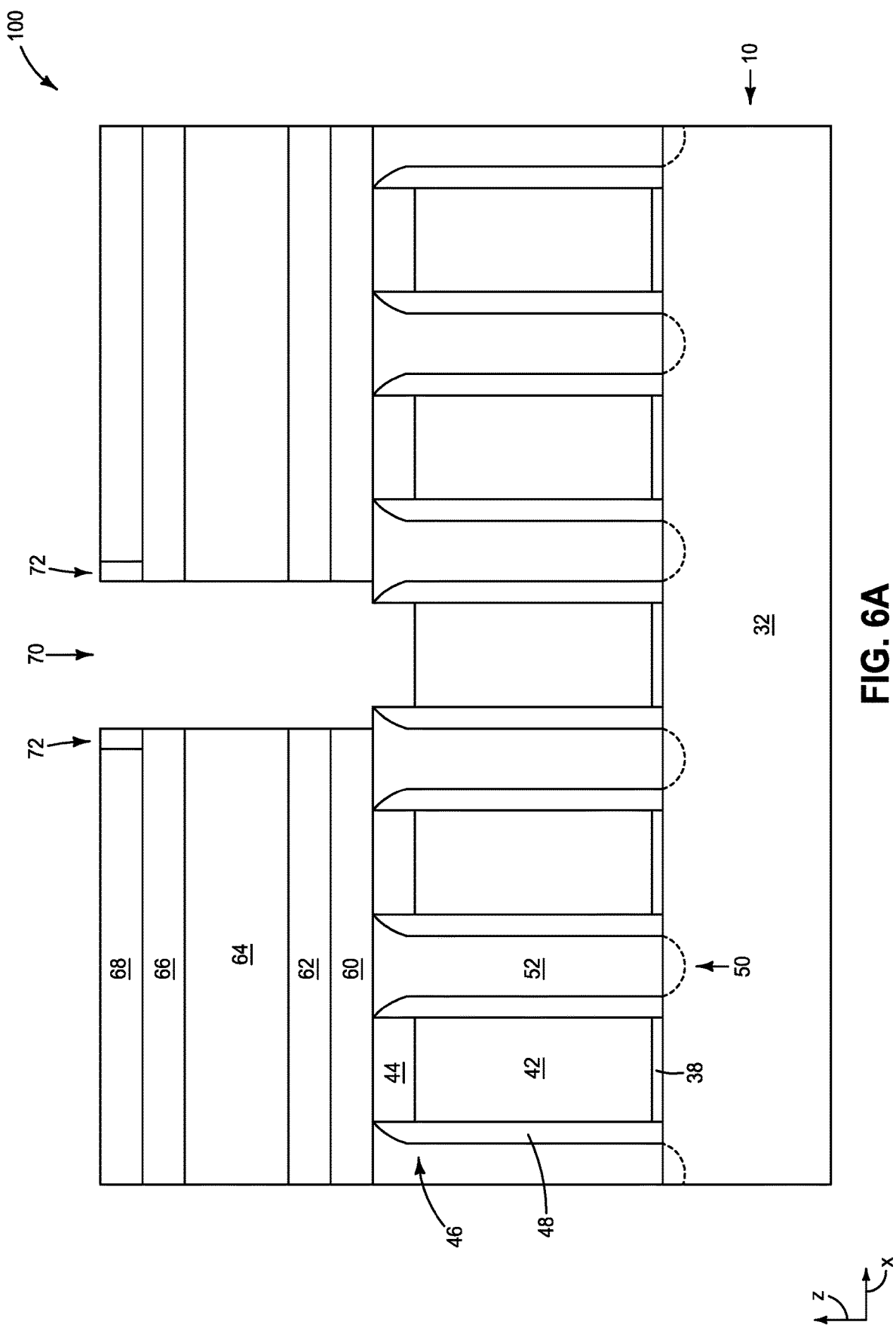

FIG. 6A shows a process stage similar to that of FIG. 6, but shows that the opening 70 may be modified with a spacer 72 to narrow the opening prior to extending the opening. Accordingly, the overall size of the opening 70 may be reduced beyond a lithographic limit, which may be advantageous in applications having high integration density. The spacer 72 may comprise any suitable composition(s), including, for example, silicon dioxide, aluminum oxide, hafnium oxide, etc.

Figure 6B:
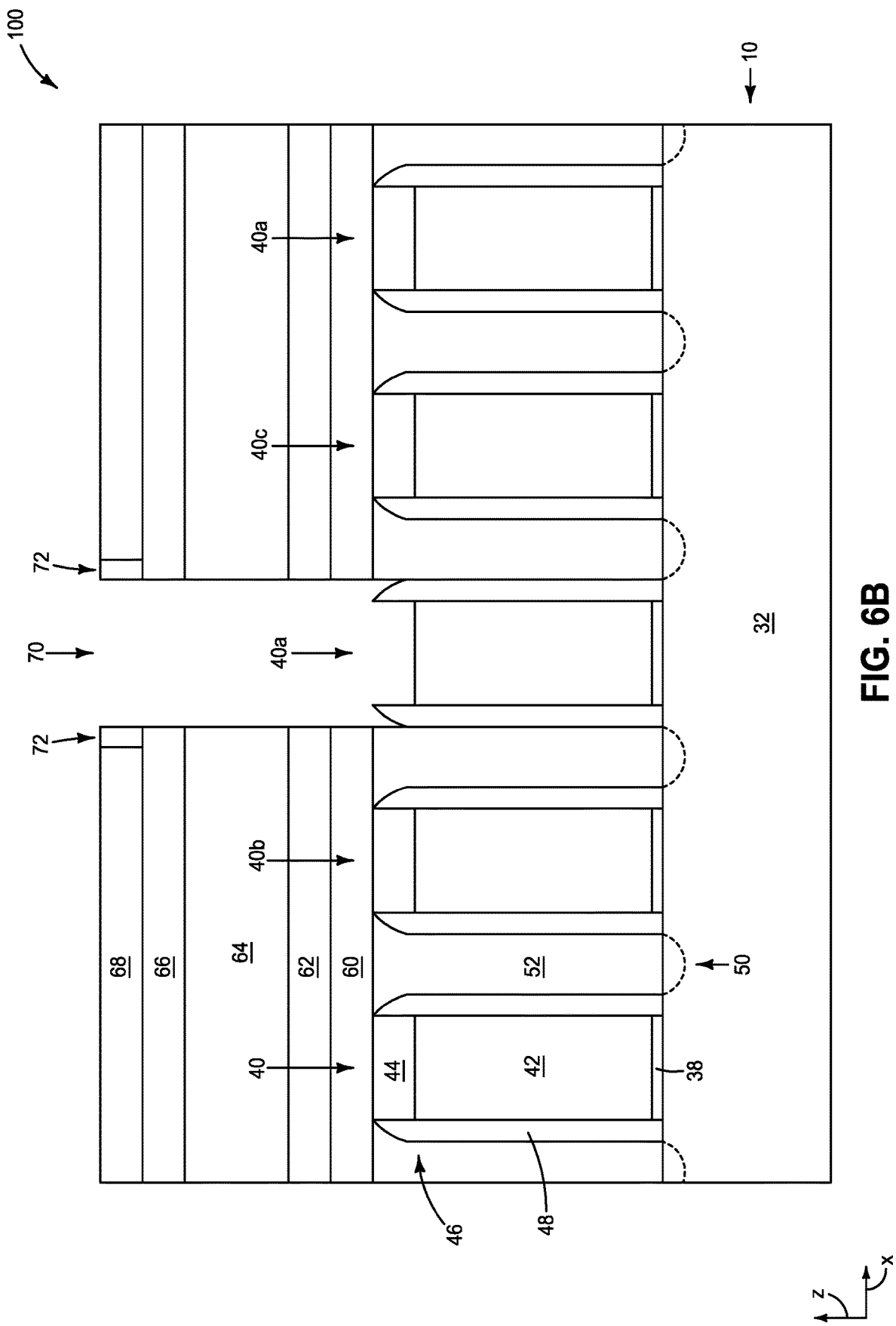

The processing of FIGS. 6 and 6A shows the etching conditions utilized to extend the opening 70 through the capping material 44 to be highly selective for the capping material relative to the adjacent materials 48 and 52. In other embodiments, the etching conditions may be less highly selective. For instance, FIG. 6B shows a processing stage similar to that of FIG. 6A, but shows that the etching conditions have penetrated into the insulative material 52.

Figure 7:
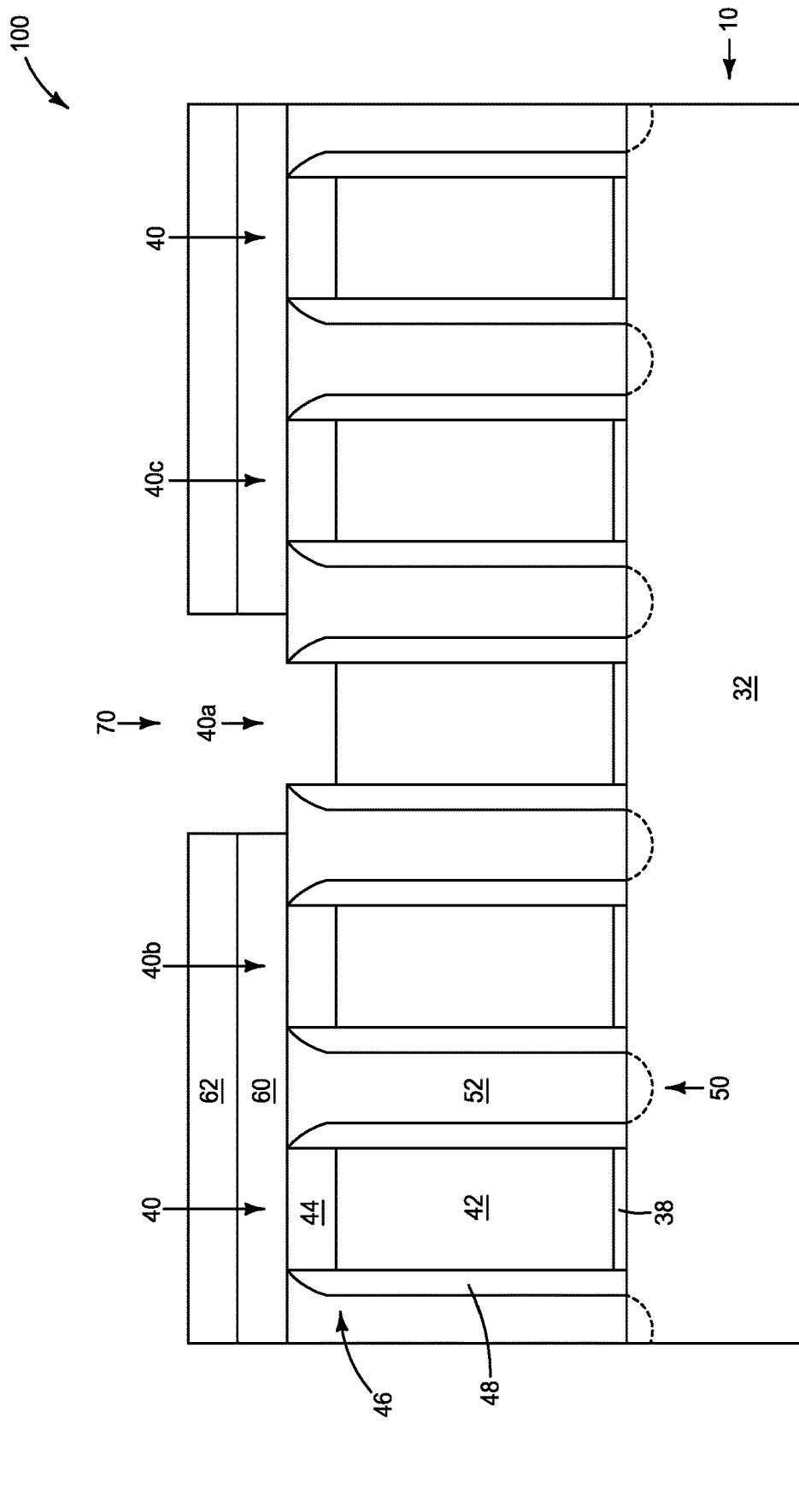
FIG. 7 is a diagrammatic cross-sectional side view of an example region of the example CMOS-containing semiconductor base of FIGS. 4, 4A and 4B at an example process stage following that of FIG. 6.

Referring to FIG. 7, the region 100 is shown at a process stage subsequent to that of FIG. 6. Specifically, the materials 64, 66 and 68 have been removed. In some embodiments, the upper material 62 of FIG. 7 may be thinned during the processing utilized to remove the materials 64, 66 and 68.

Figure 8:
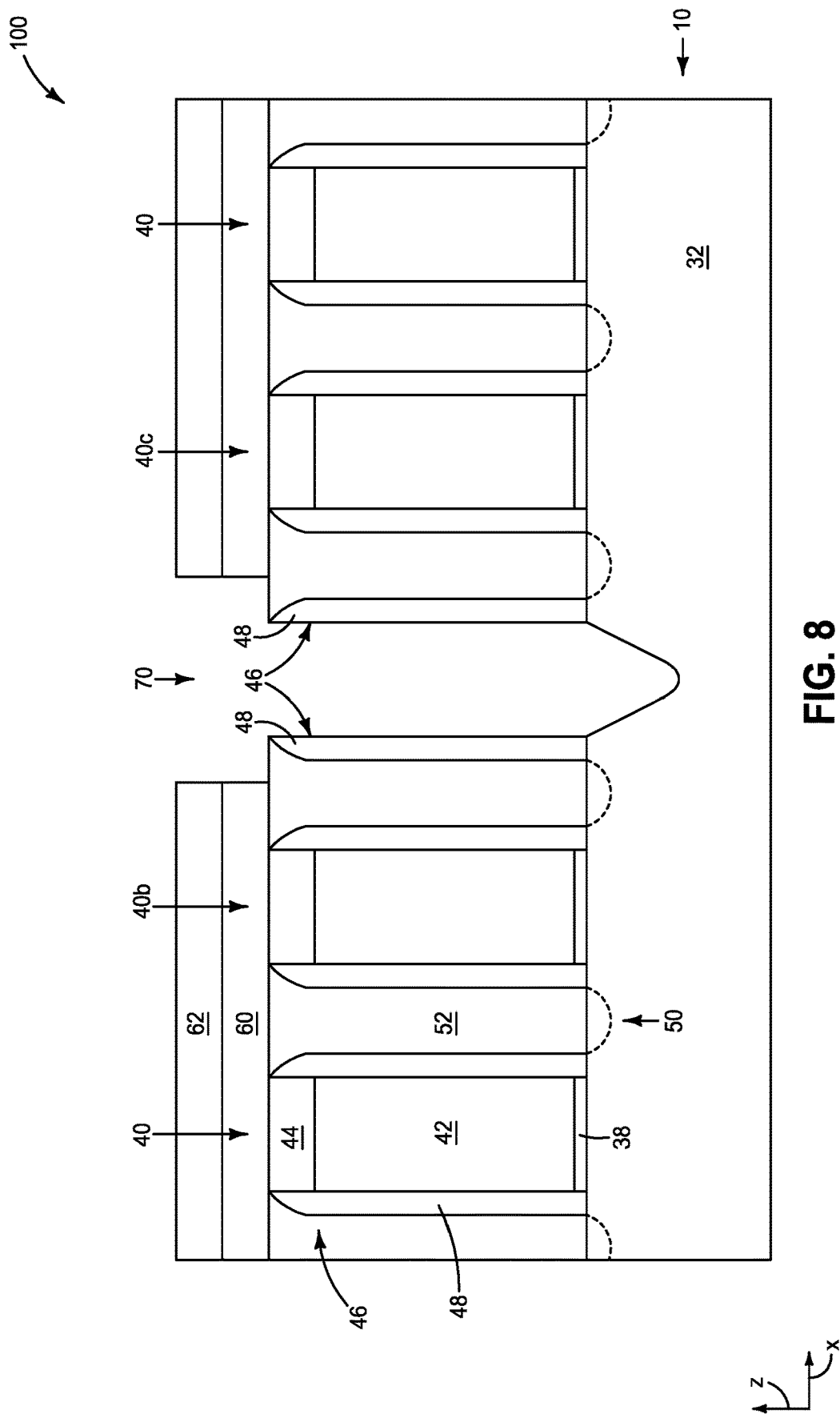
FIG. 8 is a diagrammatic cross-sectional side view of an example region of the example CMOS-containing semiconductor base of FIGS. 4, 4A and 4B at an example process stage following that of FIG. 7.

Referring to FIG. 8, the opening 70 is extended through the primary material 42 of the central linear structure 40a (FIG. 7), through the dielectric material 38 and into the semiconductor material 32 of the fin 10. According, the opening 70 is formed to extend downwardly between the sidewall spacers 46 of the central linear structure 40a (FIG. 7) and into the fin 10.

Figure 8A:
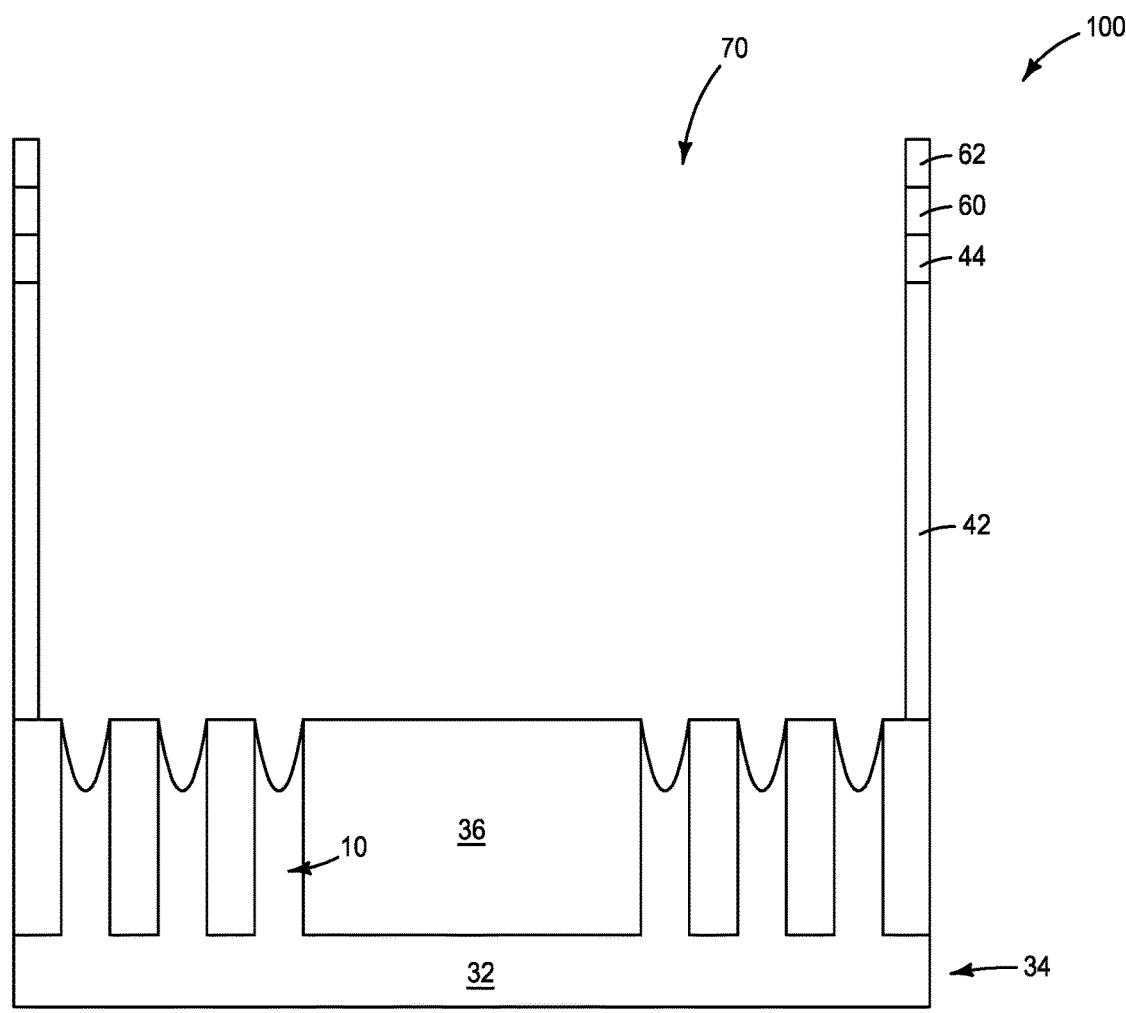
FIGS. 8A and 8B are diagrammatic cross-sectional side views of a region of the example CMOS-containing semiconductor base of FIG. 8 along a cross-section orthogonal to that of FIG. 8.
Figure 8B:
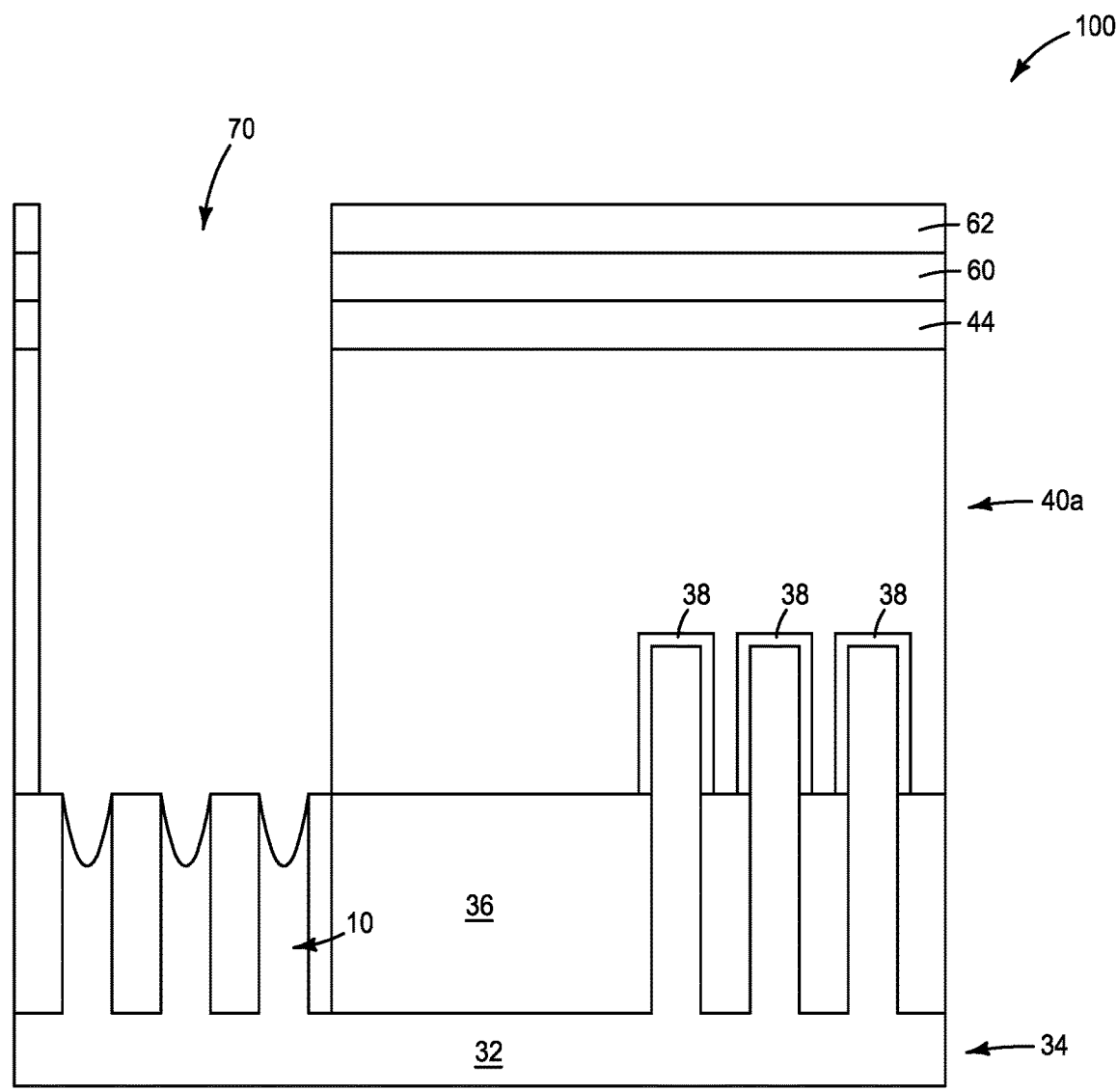

FIG. 8A shows a cross-section along the y-axis direction at the processing stage of FIG. 8 (i.e., shows a view along the same cross-section as the view of FIG. 5B), and shows that the opening 70 may be extended into all of the fins 10 which are overlapped by the central linear structure 40a (FIG. 5B). In contrast, FIG. 8B shows an embodiment in which the opening 70 is formed to extend across only some of the fins overlapped by the central linear structure 40a. In some embodiments, the central linear structure 40a may be considered to extend across a plurality of fins 10 (with such plurality including six of the fins 10 in the illustrated embodiment, as shown in the top-down view of FIG. 4A). FIG. 8A may be considered to illustrate an embodiment in which the opening 70 is large enough so that the segment of the linear structure 40a removed by such opening extends across all of the fins of the plurality of fins overlapped by the linear structure 40a, and FIG. 8B may be considered to illustrate an embodiment in which the opening 70 is of suitable dimension so that the segment of the linear structure 40a removed with such opening extends across only some of the fins of the plurality of fins overlapped by the linear structure 40a.

Figure 8C:
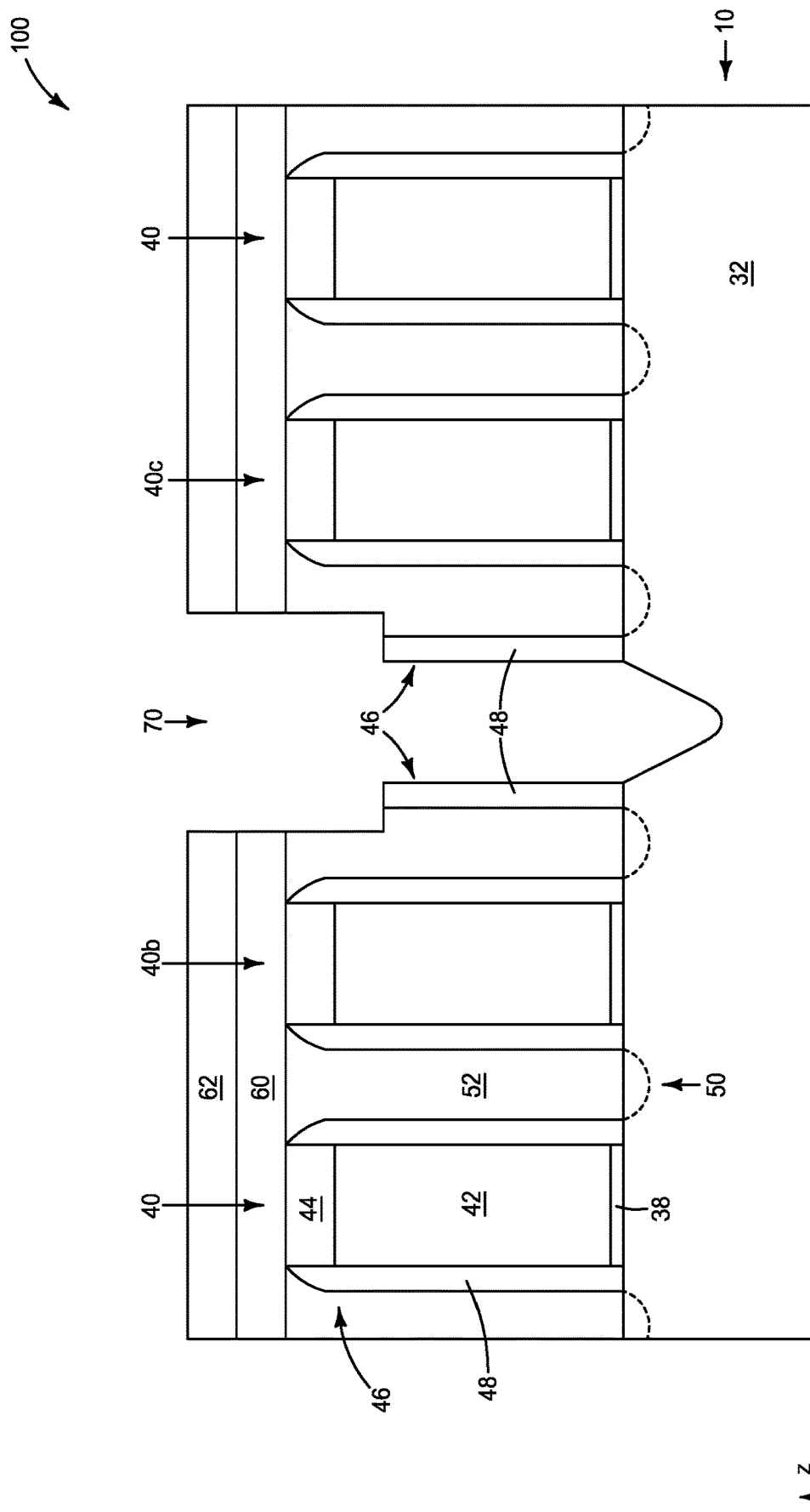
FIG. 8C is a diagrammatic cross-sectional side view of a region of the example CMOS-containing semiconductor base of FIGS. 4, 4A and 4B at an example process stage following that of FIG. 7 and alternative to that of FIG. 8.

FIG. 8 shows an embodiment in which the opening 70 is extended with an etch which is highly selective for the semiconductor material 32, the dielectric material 38 and the primary material 42 relative to the insulative materials 48 and 52. In other embodiments, the etching may be less selective, as shown with an example embodiment of FIG. 8C.

Figure 9:
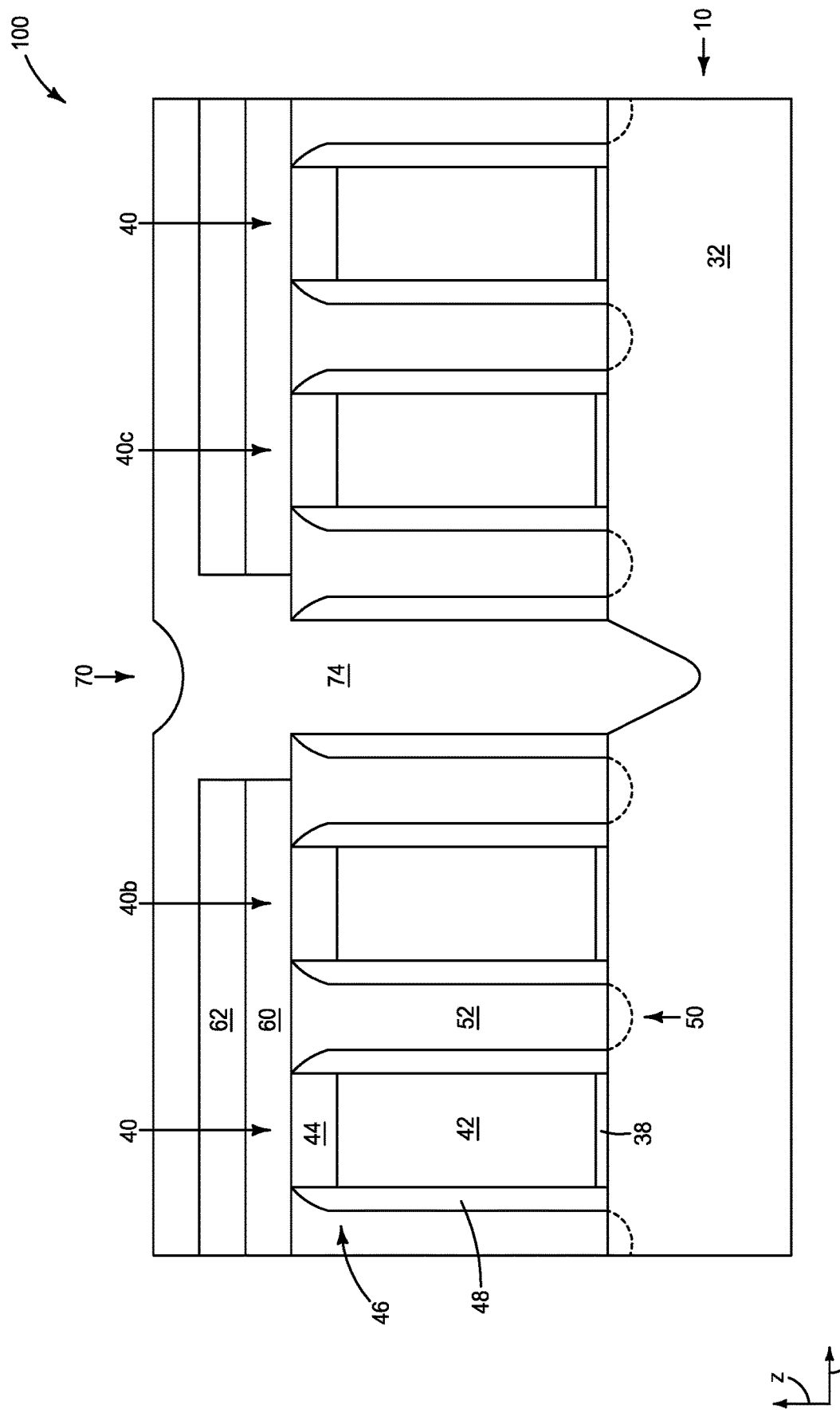
FIG. 9 is a diagrammatic cross-sectional side view of an example region of the example CMOS-containing semiconductor base of FIGS. 4, 4A and 4B at an example process stage following that of FIG. 8.

Referring to FIG. 9, the region 100 is shown at a process stage subsequent to that of FIG. 8. Insulative material 74 is formed within the opening 70 to fill the opening. The insulative material 74 may comprise any suitable composition(s), and in some embodiments may comprise, consist essentially of, or consist of silicon dioxide. Although only a single homogeneous material is shown filling the opening 70, in other embodiments two or more insulative materials may be utilized to fill the opening 70.

Figure 10:
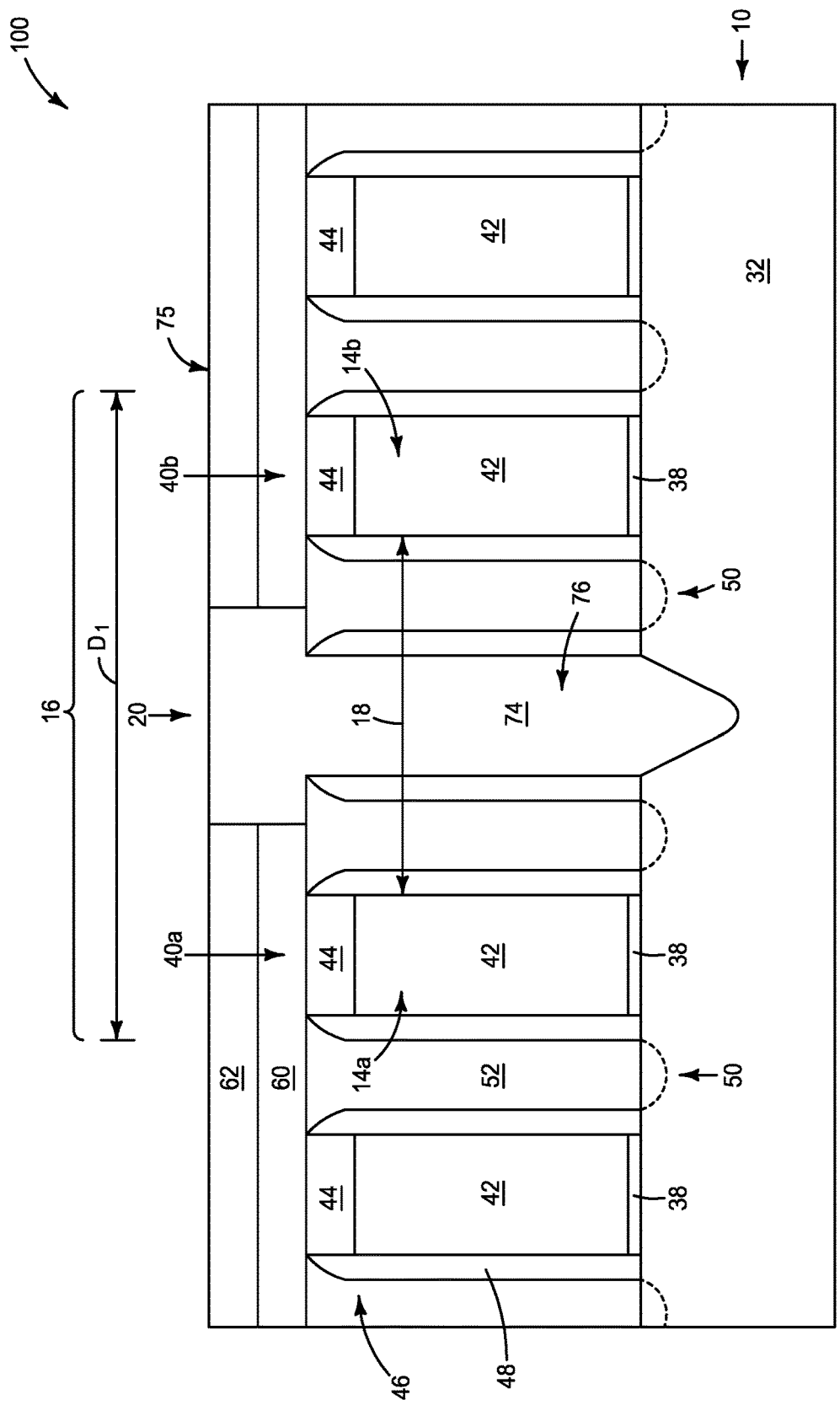
FIG. 10 is a diagrammatic cross-sectional side view of an example region of the example CMOS-containing semiconductor base of FIGS. 4, 4A and 4B at an example process stage following that of FIG. 9.

Referring to FIG. 10, the integrated assembly 100 is subjected to polishing (e.g., CMP) to remove the excess material 74 from over the upper surface of the material 62 and form a planarized surface 75 extending across the materials 74 and 62. The assembly 100 of FIG. 10 may be considered to include a configuration of the circuit arrangement 16 described above with reference to FIG. 3. Specifically, the primary material 44 of the outer linear structures 40a and 40b may correspond to the gating structures 14a and 14b, with such gating structures being laterally spaced from another by an intervening region 18 which includes an insulative structure 76 corresponding to the insulative material 74. In some embodiments, the insulative material 74 of FIG. 10 may be considered to be the same as the insulative material 22 described above with reference to FIG. 3, and the structure 76 may be considered to correspond to an insulative structure formed within a region of a missing gate structure (i.e., the gate structure that would otherwise be present in the location of the central linear structure 40a of FIGS. 4 and 4A).

The circuit arrangement 16 of FIG. 10 may be incorporated into the assembly 300 of FIG. 3, and accordingly may have the dimension $D_1$ along the illustrated x-axis direction. The incorporation of the circuit arrangement 16 into the assembly 300 of FIG. 3 may comprise forming the memory arrays 202a and 202b to be offset from the circuit arrangement 16, and then forming the electrical connections from digit lines of the memory arrays to a conductive bar 26 (shown in FIG. 3, but not in FIG. 10) associated with the circuit arrangement 16.

The insulative structure 76 may be optionally modified to include two or more different insulative materials. Such may enable the dielectric properties and/or stress properties associated with such insulative structure to be tailored for specific applications. An example of such optional modification is described with reference to FIGS. 11-13.

Figure 11:
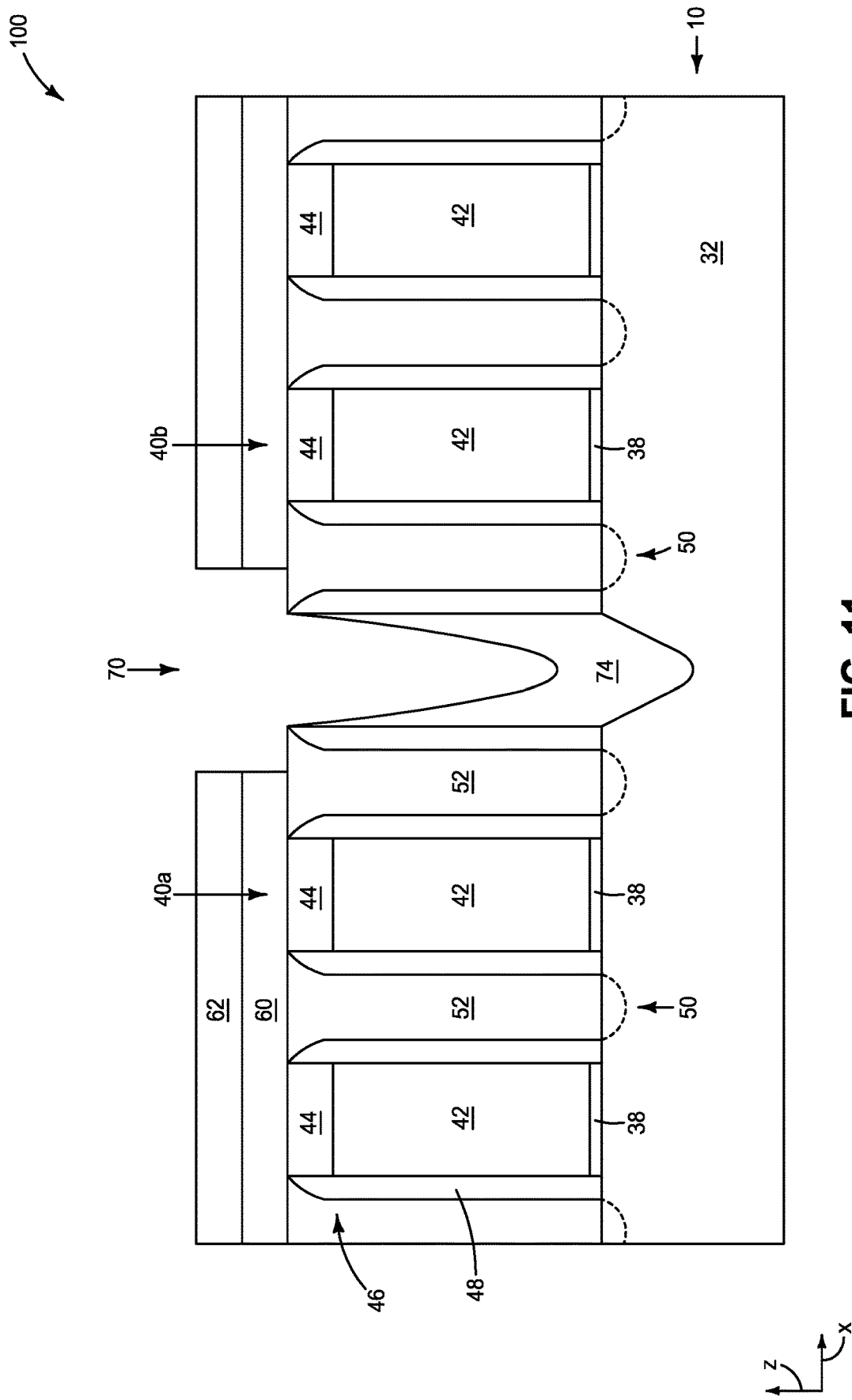
FIG. 11 is a diagrammatic cross-sectional side view of an example region of the example CMOS-containing semiconductor base of FIGS. 4, 4A and 4B at an example process stage following that of FIG. 9 and alternative to that of FIG. 10.

Referring to FIG. 11, the insulative material 74 is recessed within the opening 70.

Figure 12:
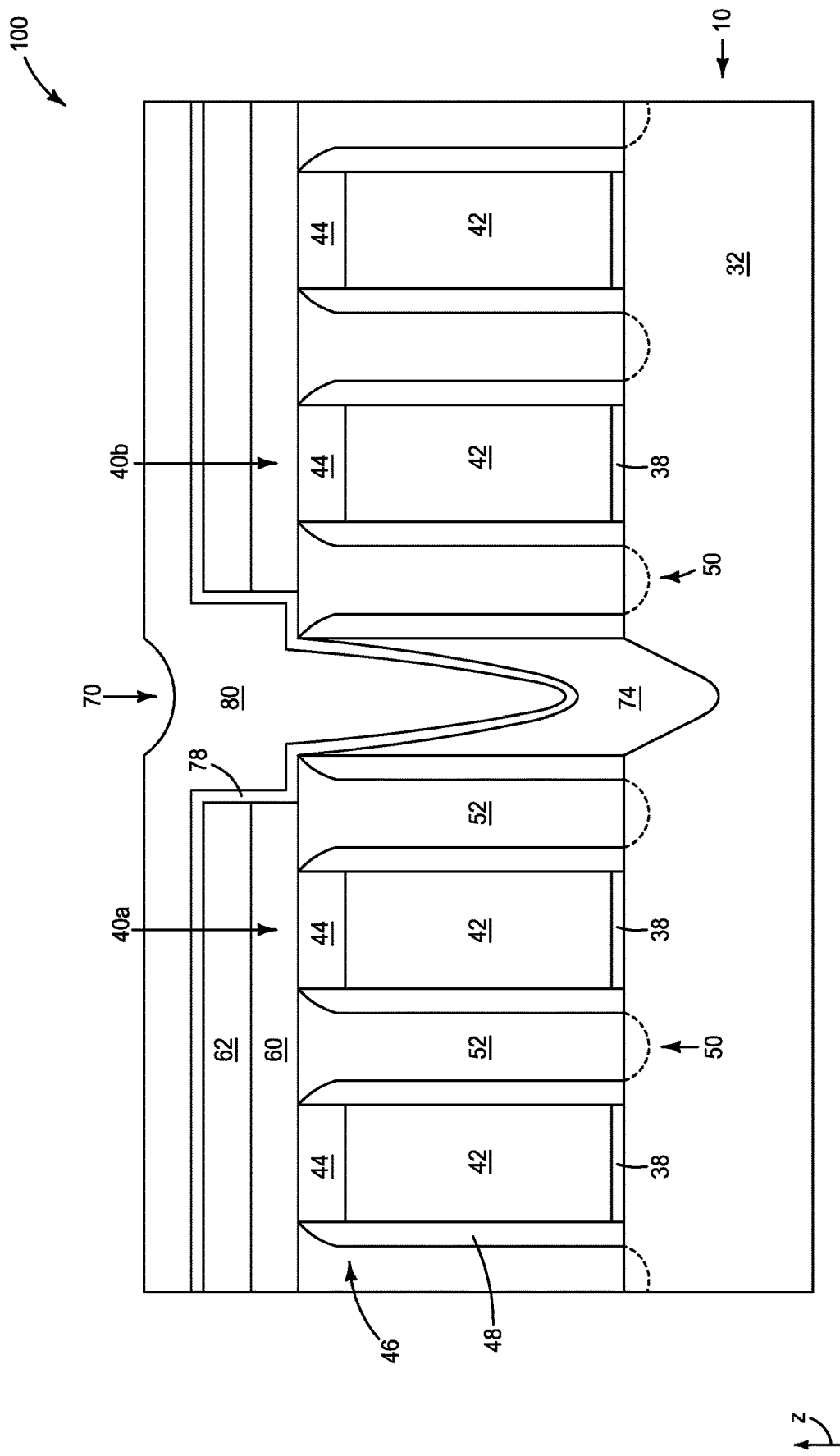
FIGS. 12-16 are diagrammatic cross-sectional side views of an example region of the example CMOS-containing semiconductor base of FIGS. 4, 4A and 4B at sequential example process stages following that of FIG. 11.

Referring to FIG. 12, additional insulative materials 78 and 80 are formed within the opening 70 and over the recessed material 74. The materials 78 and 80 may comprise any suitable compositions. In some embodiments, the material 78 may comprise, consist essentially of, or consist of silicon nitride; and the material 80 may comprise, consist essentially of, or consist of silicon dioxide.

Figure 13:
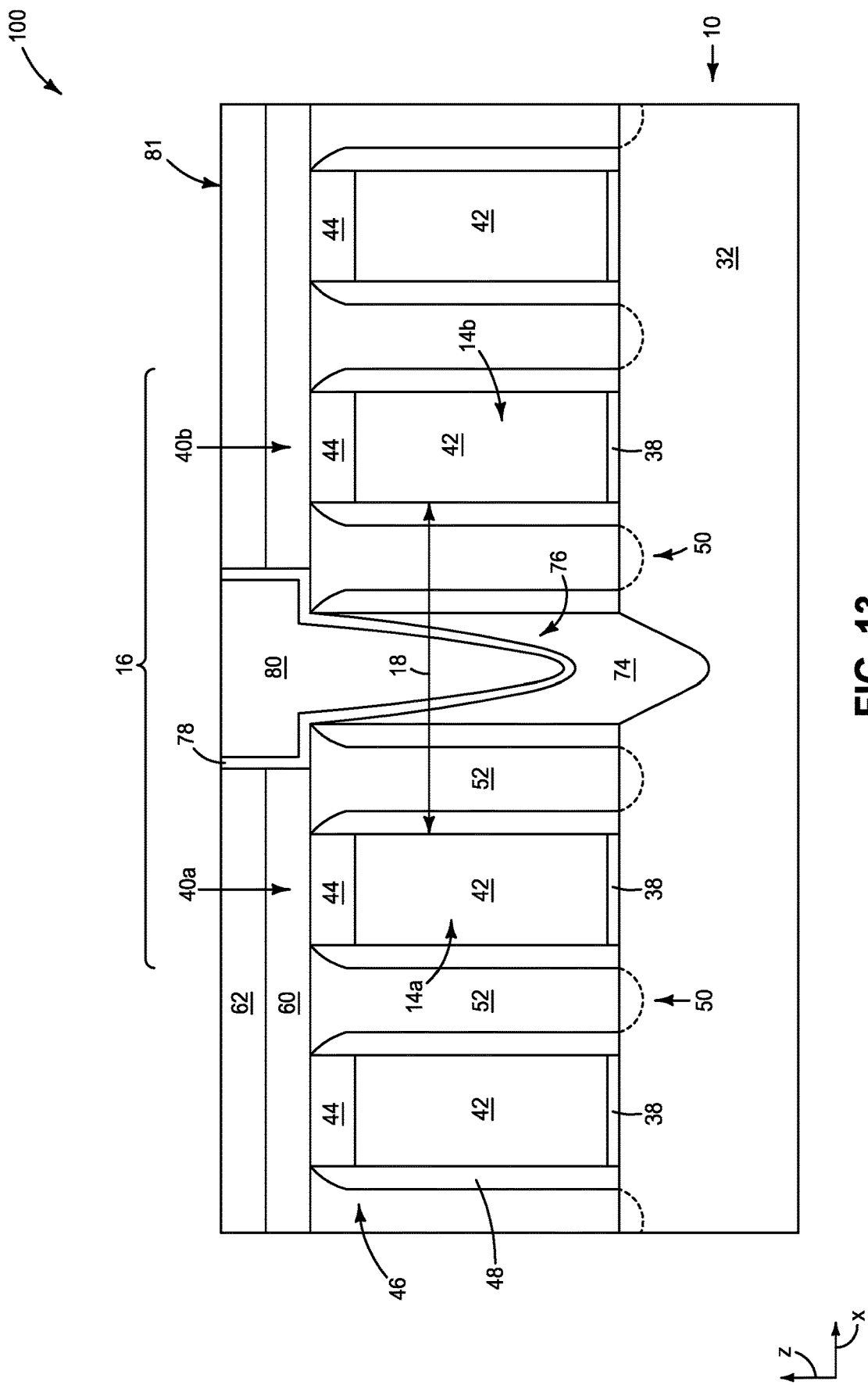

Referring to FIG. 13, the integrated assembly 100 is subjected to polishing (e.g., CMP) to remove the excess materials 78 and 80 from over the upper surface of the material 62 and form a planarized surface 81 extending across the materials 78, 80 and 62. The assembly 100 of FIG. 13 may be considered to include a configuration of the circuit arrangement 16 described above with reference to FIG. 3. Specifically, the primary material 44 of the outer linear structures 40a and 40b may correspond to the gating structures 14a and 14b, with such gating structures being laterally spaced from another by an intervening region 18 which includes the insulative structure 76 modified to comprise the insulative materials 78 and 80 in addition to the material 74. In some embodiments, the insulative materials 74, 78 and 80 of FIG. 13 may be considered together to be the same as the insulative material 22 described above with reference to FIG. 3.

The insulative structure 76 of FIG. 13 comprises three vertically-stacked materials 74, 78 and 80. Although the structure 76 is shown comprising three vertically-stacked materials, in other embodiments the structure 76 may comprise a different number of vertically-stacked materials than the illustrated three materials, and may generally be considered to comprise two or more vertically-stacked materials. In the illustrated embodiment, the insulative material 78 may be considered to be vertically sandwiched between upper and lower regions comprising the materials 74 and 80. In some embodiments, the materials 74 and 80 may comprise a same composition as one another (which may be referred to as a first insulative material composition), and the material 78 may comprise a composition different from that of the materials 74 and 80 (which may be referred to as a second insulative material composition). In some embodiments, the materials 74 and 80 may both comprise, consist essentially of, or consist of silicon dioxide, and the material 78 may comprise, consist essentially of, or consist of silicon nitride.

The example embodiments of FIGS. 10 and 13 show the gating structures 14a and 14b to include the primary material 42 of the linear structures 40a and 40b. In other embodiments, the primary material 42 may be a sacrificial material which is removed and replaced with conductive material. An example of such other embodiments is described with reference to FIGS. 14-16.

Figure 14:
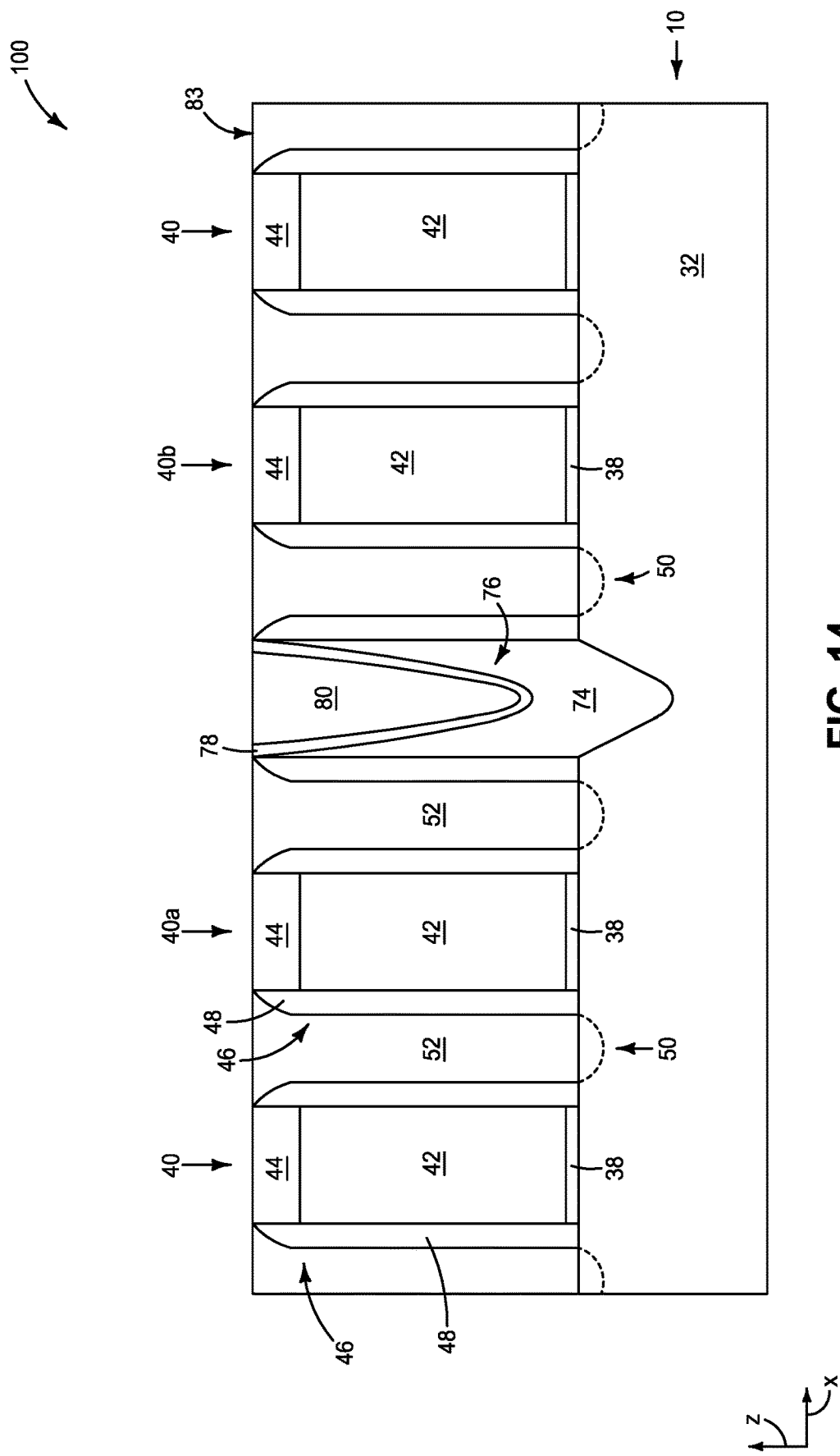

Referring to FIG. 14, the assembly 100 subjected to planarization (e.g., CMP) to remove the materials 60 and 62, and form a planarized surface 83 extending across the materials 44, 48, 52, 78 and 80.

Figure 15:
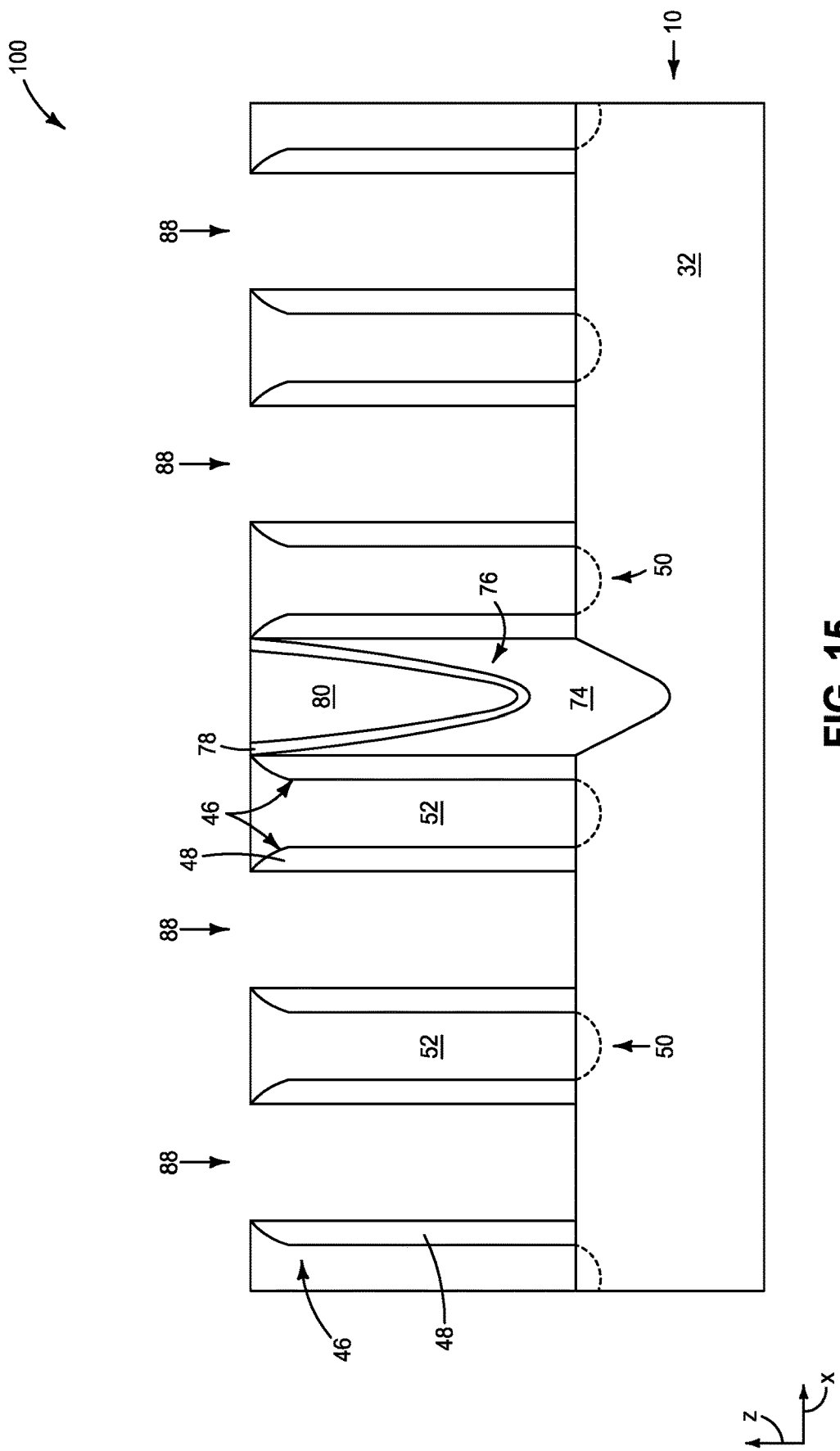

Referring to FIG. 15, the materials 38, 42 and 44 are removed from the locations of the linear structures 40 (FIG. 14) to form openings 88.

Figure 16:
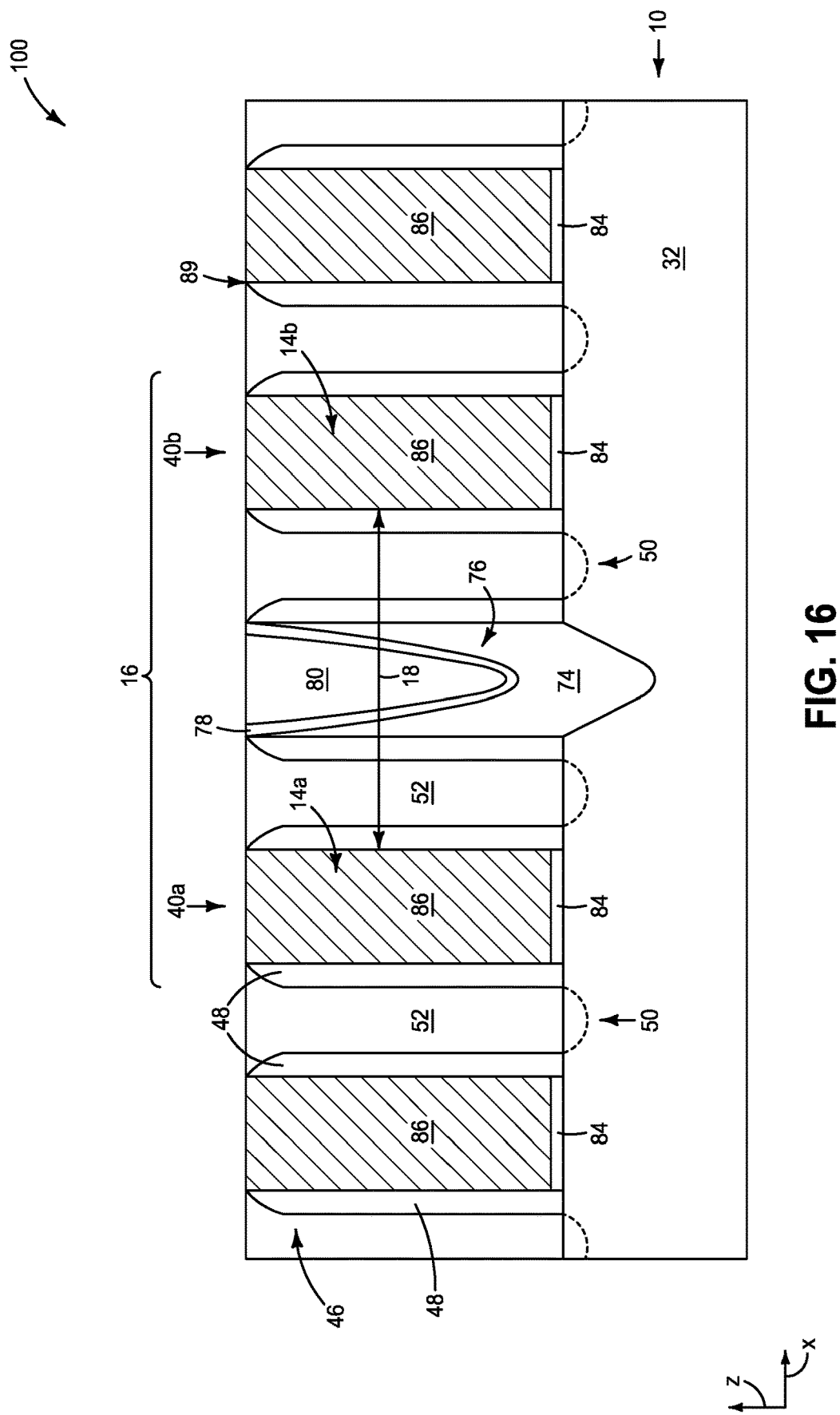

Referring to FIG. 16, gate dielectric material 84 is formed along the material 32 at the bottoms of the openings 88 (FIG. 15), and conductive material 86 is formed over the gate dielectric material 84. A planarized surface 89 is formed across the material 86 at an upper surface of the assembly 100. The planarized surface 89 may be formed with any suitable processing, including, for example, CMP.

The gate dielectric material 84 may comprise any suitable composition(s), and in some embodiments may comprise, consist essentially of, or consist of one or more of silicon dioxide, hafnium oxide, zirconium oxide, aluminum oxide, tantalum oxide, etc.

The material 86 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the material 86 may comprise one or more metal-containing materials, such as, for example, one or more of tungsten, titanium, tungsten nitride, titanium nitride, etc.

The assembly 100 of FIG. 16 may be considered to include the configuration of the circuit arrangement 16 described above with reference to FIG. 3. Specifically, the conductive material 86 may be considered to replace the primary material 42 of the outer linear structures 40a and 40b, and may be considered to correspond to the gating structures 14a and 14b. The gating structures 14a and 14b are laterally spaced from one another by an intervening region 18 which includes the insulative structure 76.

Figure 17:
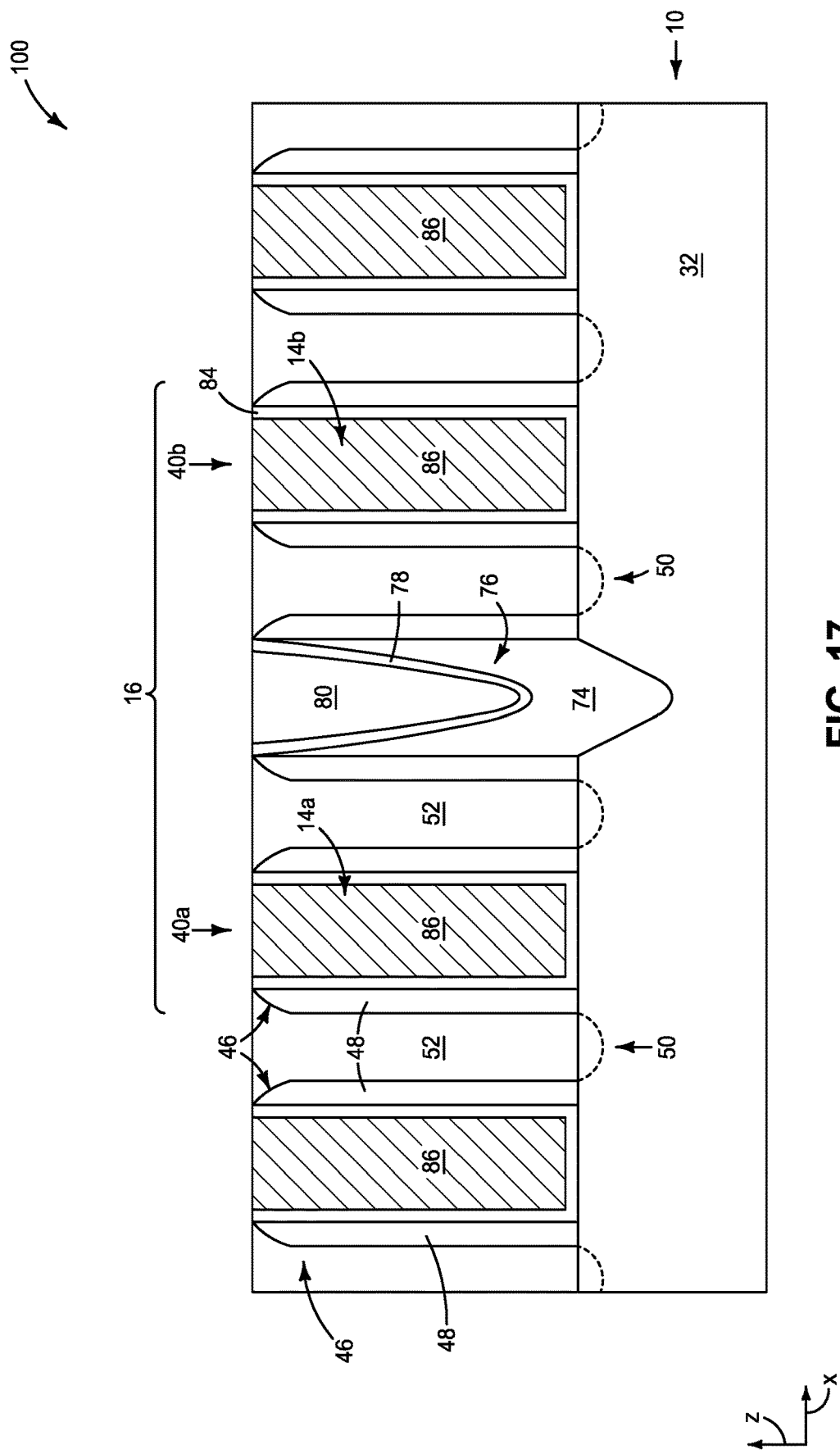
FIG. 17 is a diagrammatic cross-sectional side view of an example region of the example CMOS-containing semiconductor base of FIGS. 4, 4A and 4B at an example process stage following that of FIG. 15 and alternative to that of FIG. 16.

The embodiment of FIG. 16 shows the dielectric material 84 being formed only along the semiconductor material 32 at the bottoms of the openings 88 (FIG. 15). In other embodiments, the dielectric material 84 may line the openings 88 (as shown in FIG. 17), and then the conductive material 86 may be formed within the lined openings. The assembly 100 of FIG. 17 may be considered to include another example configuration of the circuit arrangement 16 described above with reference to FIG. 3.

Figure 18:
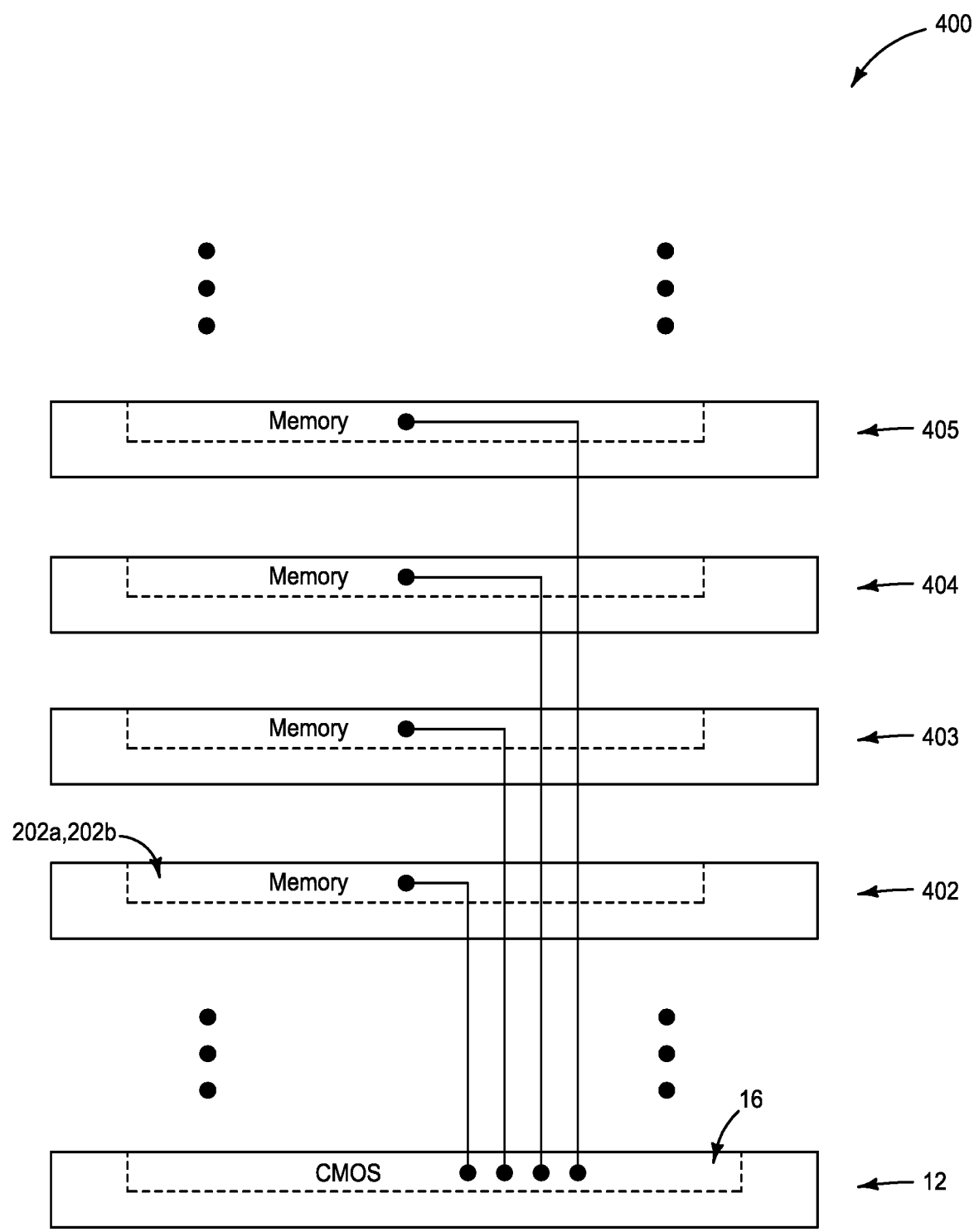
FIG. 18 is a diagrammatic side view of an example region of an example multideck assembly.

In some embodiments, the CMOS region 100 of FIG. 3 may be under the memory arrays 202a and 202b within a multideck configuration. For instance FIG. 18 shows an example multideck configuration 400 which includes a base 12, and includes several memory decks 402-405 over the base. Although the illustrated configuration includes four of the memory decks, it is to be understood that other configurations may have more than four memory decks or fewer than four memory decks. For instance, some configurations may include only a single memory deck. In some embodiments, the base 12 may be referred to as a deck which is provided beneath the memory decks 402405.

The illustrated decks 12 and 402405 may be considered to be examples of levels that are stacked one atop the other. The levels may be within different semiconductor dies, or at least two of the levels may be within the same semiconductor die. The memory decks 402405 may comprise memory arrays, or at least portions of memory arrays. The memory arrays within the various decks may be the same as one another (e.g., may all be DRAM arrays, ferroelectric memory arrays, NAND memory arrays, etc.), or may be different relative to one another (e.g., some may be DRAM arrays, while others are NAND memory arrays, ferroelectric memory arrays, etc.). Also, one or more of the upper decks may include control circuitry, sensor circuitry, etc.

The memory within the deck 402 is diagrammatically indicated to contain memory arrays 202a and 202b of the types described above with reference to FIG. 3. Accordingly, wordlines and digit lines (analogous to the wordlines 206 and digit lines 210 of FIG. 1) may be associated the memory deck 402.

The base 12 may include CMOS, and may include the circuit arrangement 16. The region 16 is diagrammatically illustrated to be coupled with the memory arrays 202a and 202b within the deck 402. In some embodiments, the region 16 comprises SENSE AMPLIFIER circuitry which is coupled with digit lines of the memory arrays 202a and 202b.

In the shown embodiment, electrical couplings from the memory circuitries within the decks 402-405 to the CMOS circuitry within the base 12 are shown to extend through the decks. Such may be accomplished utilizing sockets or other suitable regions as conduits for conductive lines passing through the various decks. Alternatively, at least some of the electrical coupling from the decks to the base may extend laterally around the decks.

In the illustrated embodiment, the CMOS circuitry within the base 12 is directly under the memory arrays of the decks 402-405. In other embodiments, at least some of the CMOS circuitry may be laterally offset relative to the memory circuitry within the upper decks 402-405, as well as being vertically offset relative to the memory circuitry within such decks.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a CMOS region which includes fins extending along a first direction, and which includes gating structures extending across the fins and being on a first pitch. A circuit arrangement is associated with the CMOS region and includes a pair of the gating structures spaced by an intervening region having a missing gating structure. The pair of the gating structures thus being on an extended pitch larger than the first pitch. The circuit arrangement has a first dimension along the first direction. A second region is proximate to the CMOS region. Conductive structures are associated with the second region and extend along a second direction substantially orthogonal to the first direction. Some of the conductive structures are electrically coupled with the circuit arrangement. The conductive structures are on a second pitch different from the first pitch. A second dimension is a distance across said some of the conductive structures along the first direction. The conductive structures and the circuit arrangement are aligned such that the second dimension is substantially the same as the first dimension.

Some embodiments include an integrated assembly comprising a first memory array region laterally offset from a second memory array region. A CMOS region is laterally between the first and second memory array regions. Fins extend along a first direction across the CMOS region. Gating structures extend across the fins and are on a first pitch. A SENSE AMPLIFIER circuit is associated with the CMOS region and comprises a pair of the gating structures spaced by an intervening region having a missing gating structure. Said pair of the gating structures thus being on an extended pitch larger than the first pitch. The SENSE AMPLIFIER circuit has a first dimension along the first direction. First digit lines are associated with the first memory array region and extend along a second direction different than the first direction. Some of the first digit lines are electrically coupled with the SENSE AMPLIFIER circuit. A second dimension is a distance across said some of the first digit lines along the first direction. The first digit lines and the SENSE AMPLIFIER circuit are aligned such that the second dimension is substantially the same as the first dimension. Second digit lines are associated with the second memory array region. Some of the second digit lines are electrically coupled with the SENSE AMPLIFIER circuit. The second dimension is a distance across said some of the second digit lines along the first direction.

Some embodiments include a method of forming an integrated assembly. A construction is formed to comprise a CMOS region. The CMOS region comprises a semiconductor material configured to include fins projecting upwardly from a base region. The fins extend along a first direction. The CMOS region comprises linear structures over the fins, with the linear structures extending along a second direction. The linear structures include a primary material, a capping material over the primary material, and sidewall spacers along lateral edges of the primary material. One of the linear structures is a central linear structure and is laterally between two others of the linear structures. Said two others of the linear structures are outer linear structures. The primary material and the capping material of at least a segment of the central linear structure are removed to form an opening extending downwardly between the sidewall spacers of the central linear structure. Said opening is filled with one or more insulative materials to form an insulative structure. A circuit arrangement is formed to include a pair of the gating structures at locations of the outer linear structures, with said pair of the gating structures being laterally spaced from one another by an intervening region comprising the insulative structure. The circuit arrangement has a first dimension along the first direction. A memory array is formed to be offset from the CMOS region and to have conductive structures extending along the second direction. Some of the conductive structures are electrically coupled with the circuit arrangement. A second dimension is a distance across said some of the conductive structures along the first direction. The conductive structures and the circuit arrangement are aligned such that the second dimension is substantially the same as the first dimension.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:
1. An integrated assembly, comprising:
a CMOS region; the CMOS region including fins extending along a first direction, and including gating structures extending across the fins and being on a first pitch;
a circuit arrangement associated with the CMOS region and comprising a pair of the gating structures spaced by an intervening region comprising a missing gating structure; said pair of the gating structures thus being on an extended pitch larger than the first pitch; the circuit arrangement having a first dimension along the first direction;
a second region proximate the CMOS region; and
conductive structures associated with the second region and extending along a second direction substantially orthogonal to the first direction; some of the conductive structures being electrically coupled with the circuit arrangement; the conductive structures being on a second pitch different from the first pitch; a second dimension being a distance across said some of the conductive structures along the first direction; the conductive structures and the circuit arrangement being aligned such that the second dimension is substantially the same as the first dimension.

2. The integrated assembly of claim 1 wherein the intervening region includes only a single insulative material within a location of the missing gating structure.

3. The integrated assembly of claim 1 wherein the intervening region includes two or more vertically-stacked insulative materials within a location of the missing gating structure.

4. The integrated assembly of claim 3 wherein said two or more vertically-stacked insulative materials include a second insulative material vertically sandwiched between upper and lower regions comprising a first insulative material.

5. The integrated assembly of claim 4 wherein the first insulative material comprises silicon dioxide and the second insulative material comprises silicon nitride.

6. The integrated assembly of claim 1 wherein the conductive structures are digit lines.

7. The integrated assembly of claim 6 wherein the circuit arrangement comprises a SENSE AMPLIFIER.

8. The integrated assembly of claim 1 wherein the second region is laterally offset relative to the CMOS region.

9. The integrated assembly of claim 1 wherein the second region is vertically offset relative to the CMOS region.

10. The integrated assembly of claim 1 wherein another of the conductive structures is within said second dimension in addition to said some of the conductive structures that are electrically coupled with the circuit arrangement.

11. An integrated assembly, comprising:
a first memory array region laterally offset from a second memory array region;
a CMOS region laterally between the first and second memory array regions; fins extending along a first direction across the CMOS region; gating structures extending across the fins and being on a first pitch; a SENSE AMPLIFIER circuit associated with the CMOS region and comprising a pair of the gating structures spaced by an intervening region comprising a missing gating structure; said pair of the gating structures thus being on an extended pitch larger than the first pitch; the SENSE AMPLIFIER circuit having a first dimension along the first direction;
first digit lines associated with the first memory array region and extending along a second direction different than the first direction; some of the first digit lines being electrically coupled with the SENSE AMPLIFIER circuit; a second dimension being a distance across said some of the first digit lines along the first direction; the first digit lines and the SENSE AMPLIFIER circuit being aligned such that the second dimension is substantially the same as the first dimension; and second digit lines associated with the second memory array region; some of the second digit lines being electrically coupled with the SENSE AMPLIFIER circuit; the second dimension being a distance across said some of the second digit lines along the first direction.

12. The integrated assembly of claim 11 wherein the second direction is substantially orthogonal to the first direction.

13. The integrated assembly of claim 11 wherein the second digit lines extend along the second direction.

14. The integrated assembly of claim 11 wherein said some of the first digit lines are comparatively coupled with said some of the second digit lines through the SENSE AMPLIFIER circuit.

15. The integrated assembly of claim 11 wherein the intervening region includes only a single insulative material within a location of the missing gating structure.

16. The integrated assembly of claim 11 wherein the intervening region includes two or more vertically-stacked insulative materials within a location of the missing gating structure.

17. The integrated assembly of claim 11 wherein the first and second memory array regions are vertically offset relative to the CMOS region.

\* \* \* \* \*